United States Patent
Kimura et al.

(10) Patent No.: US 9,099,576 B2
(45) Date of Patent: Aug. 4, 2015

(54) PHOTOELECTRIC CONVERSION DEVICE AND MANUFACTURING METHOD THEREOF

(75) Inventors: Hajime Kimura, Kanagawa (JP); Yoshiaki Ito, Tokyo (JP); Takuro Ohmaru, Kanagawa (JP); Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 1032 days.

(21) Appl. No.: 13/100,553

(22) Filed: May 4, 2011

(65) Prior Publication Data
US 2011/0273021 A1      Nov. 10, 2011

(30) Foreign Application Priority Data
May 7, 2010    (JP) .................... 2010-107536

(51) Int. Cl.
*H02J 1/00* (2006.01)
*H01L 31/02* (2006.01)
*H01L 31/0216* (2014.01)
*H01L 31/068* (2012.01)
*H01L 31/076* (2012.01)
*H02M 3/158* (2006.01)

(52) U.S. Cl.
CPC ...... *H01L 31/0201* (2013.01); *H01L 31/02167* (2013.01); *H01L 31/068* (2013.01); *H01L 31/076* (2013.01); *H02M 3/1584* (2013.01); *Y02E 10/542* (2013.01); *Y02E 10/547* (2013.01); *Y02E 10/548* (2013.01)

(58) Field of Classification Search
CPC ........................................ H02J 1/00
USPC .............................................. 307/72
See application file for complete search history.

(56) References Cited

U.S. PATENT DOCUMENTS

| 4,433,202 | A  | * | 2/1984  | Maruyama et al. ........... 136/255 |
| 4,472,641 | A  |   | 9/1984  | Dickey et al. |
| 5,161,097 | A  |   | 11/1992 | Ikeda |
| 6,111,188 | A  | * | 8/2000  | Kurokami et al. ............ 136/244 |
| 6,281,485 | B1 | * | 8/2001  | Siri ............................ 250/203.4 |
| 6,580,251 | B2 | * | 6/2003  | Takeuchi ...................... 320/138 |
| 6,757,590 | B2 |   | 6/2004  | Ross et al. |
| 7,173,400 | B2 |   | 2/2007  | Morioka |
| 7,443,052 | B2 |   | 10/2008 | Wendt et al. |

(Continued)

FOREIGN PATENT DOCUMENTS

| EP | 1 536 549 A2 | 6/2005 |
| JP | 2002-108466  | 4/2002 |

(Continued)

*Primary Examiner* — Rexford Barnie
*Assistant Examiner* — Joseph Inge
(74) *Attorney, Agent, or Firm* — Husch Blackwell LLP

(57) ABSTRACT

Generation of ripples and the decrease in the output voltage of a photoelectric conversion device are suppressed. The photoelectric conversion device includes a first photoelectric conversion element; a first voltage conversion element for converting the output voltage of the first photoelectric conversion element; a second photoelectric conversion element whose characteristic is different from the characteristic of the first photoelectric conversion element; a second voltage conversion element for converting the output voltage of the second photoelectric conversion element; and a control element for controlling timing of the first voltage conversion element and the second voltage conversion element.

25 Claims, 23 Drawing Sheets

(56) References Cited

U.S. PATENT DOCUMENTS

| | | |
|---|---|---|
| 2005/0068002 A1 | 3/2005 | Ozeki |
| 2007/0164612 A1 | 7/2007 | Wendt et al. |
| 2008/0150366 A1* | 6/2008 | Adest et al. ............ 307/77 |
| 2009/0289594 A1* | 11/2009 | Sato ............ 320/101 |
| 2009/0293954 A1 | 12/2009 | Yamazaki |
| 2010/0181828 A1* | 7/2010 | Handa et al. ............ 307/9.1 |
| 2010/0301677 A1* | 12/2010 | Tomita ............ 307/82 |

FOREIGN PATENT DOCUMENTS

| | | |
|---|---|---|
| JP | 2002-136112 A | 5/2002 |
| JP | 2005-168106 A | 6/2005 |
| JP | 2006-039634 A | 2/2006 |
| JP | 2010-10667 | 1/2010 |

* cited by examiner

PHOTOELECTRIC CONVERSION DEVICE AND MANUFACTURING METHOD THEREOF

BACKGROUND OF THE INVENTION

1. Field of the Invention

One embodiment of the disclosed invention relates to photoelectric conversion devices and manufacturing methods thereof.

2. Description of the Related Art

A solar cell can be given as one of photoelectric conversion elements for directly converting light received into electric power by a photovoltaic effect and outputting the electric power (see Reference 1). Unlike a conventional method for generating electric power, in a solar cell, energy conversion into heat energy or kinetic energy is not necessary in the middle of power generation.

The output of a solar cell varies according to the amount of solar radiation, temperature, operating-point voltage, or the like. Thus, it is preferable that the load of the solar cell be adjusted and maximum electric power be always taken out from the solar cell. For this reason, an electric power conversion element is connected to the solar cell and operation for taking out the maximum electric power from the solar cell (i.e., maximum power point tracking (MPPT)) is performed by the electric power conversion element.

Maximum power point tracking (MPPT) is operation by which the desired voltage level of a solar cell is set by detection of voltage or current at the operating point of the solar cell and the output of an electric power conversion element is adjusted so that a detected voltage level and the desired voltage level agree with each other. That is, by changes in the voltage of the solar cell and detection of a current value with respect to each voltage level, the output electric power of the solar cell is calculated from the product of the voltage level and the current value. Then, the output electric power of the solar cell is controlled so as to be maximum with a voltage level at which maximum electric power is obtained used as a desired voltage level (see Reference 2).

REFERENCE

Reference 1: Japanese Published Patent Application No. 2010-010667

Reference 2: Japanese Published Patent Application No. 2002-108466

SUMMARY OF THE INVENTION

By electric power conversion operation, input voltage control, or the like of the electric power conversion element, a ripple is generated in the output of the solar cell. If the ripple is too large, the operation of the solar cell is away from the maximum output point, which causes the decrease in the output.

It is therefore an object of one embodiment of the disclosed invention to suppress generation of ripples.

Further, if the ripple is too large, the output voltage of a photoelectric conversion device decreases.

It is therefore an object of one embodiment of the disclosed invention to suppress the decrease in the output voltage of a photoelectric conversion device.

A photoelectric conversion device which includes a first photoelectric conversion element, a first electric power conversion element for controlling the first photoelectric conversion element, a second photoelectric conversion element whose characteristic is different from that of the first photoelectric conversion element, and a second electric power conversion element for controlling the second photoelectric conversion element is manufactured. A control element for performing MPPT is connected to each of the first electric power conversion element and the second electric power conversion element. Maximum electric power is obtained with the control element.

In the photoelectric conversion device, first electric power output from the first photoelectric conversion element and the first electric power conversion element is added to second electric power output from the second photoelectric conversion element and the second electric power conversion element. The control element performs control so that the ripple of output electric power obtained by addition of the first electric power and the second electric power is small.

As each of the first electric power conversion element and the second electric power conversion element, a DC-DC converter can be used, for example. A DC-DC converter is preferable because it can raise or lower DC voltage output from a solar cell.

A DC-DC converter is a circuit for converting DC voltage into different DC voltage. Typical examples of a conversion method in a DC-DC converter include a linear method and a switching method.

A DC-DC converter includes a switching element. With the switching element, time when the level of DC voltage output from a solar cell is converted into a different DC voltage level and time when the level of the DC voltage is not converted into a different DC voltage level are controlled. In other words, the DC voltage is continuously raised or lowered when the switching element is turned on, and the voltage conversion such as the increase or decrease in the DC voltage is stopped when the switching element is turned off.

The DC voltage output from the solar cell is the input voltage of the DC-DC converter. It can be said that the output voltage of the DC-DC converter is controlled by the time when the switching element is turned on and the time when the switching element is turned off.

For example, a solar cell including an amorphous semiconductor film can be used as the first photoelectric conversion element. Specifically, a solar cell including an amorphous silicon film can be used as the first photoelectric conversion element.

For example, a solar cell including a single crystal semiconductor film can be used as the second photoelectric conversion element. Specifically, a solar cell including a single crystal silicon film can be used as the second photoelectric conversion element.

The first voltage conversion element and the second voltage conversion element are controlled by the control element which is connected to the first voltage conversion element and the second voltage conversion element. The control element controls timing of the first voltage conversion element and the second voltage conversion element. The timing of the voltage conversion elements is controlled with a pulse width modulation (PWM) signal (hereinafter referred to as a PWM signal) output from the control element.

One embodiment of the disclosed invention relates to a photoelectric conversion device which includes a first photoelectric conversion element; a first voltage conversion element for converting the output voltage of the first photoelectric conversion element; a second photoelectric conversion element whose characteristic is different from the characteristic of the first photoelectric conversion element; a second voltage conversion element for converting the output voltage of the second photoelectric conversion element; and a control element for controlling timing of the first voltage conversion element and the second voltage conversion element.

One embodiment of the disclosed invention relates to a photoelectric conversion device which includes a first solar cell; a first voltage conversion element for converting the output voltage of the first solar cell; a second solar cell whose characteristic is different from the characteristic of the first solar cell; a second voltage conversion element for converting the output voltage of the second solar cell; and a control element for controlling timing of the first voltage conversion element and the second voltage conversion element.

One embodiment of the disclosed invention relates to a photoelectric conversion device which includes a first photoelectric conversion element; a first DC-DC converter for converting the output voltage of the first photoelectric conversion element; a second photoelectric conversion element whose characteristic is different from the characteristic of the first photoelectric conversion element; a second DC-DC converter for converting the output voltage of the second photoelectric conversion element; and a control element for controlling timing of the first DC-DC converter and the second DC-DC converter.

One embodiment of the disclosed invention relates to a photoelectric conversion device which includes a first solar cell; a first DC-DC converter for converting the output voltage of the first solar cell; a second solar cell whose characteristic is different from the characteristic of the first solar cell; a second DC-DC converter for converting the output voltage of the second solar cell; and a control element for controlling timing of the first DC-DC converter and the second DC-DC converter.

One embodiment of the disclosed invention relates to a photoelectric conversion device which includes a first photoelectric conversion element; a first voltage conversion element for converting the output voltage of the first photoelectric conversion element; a second photoelectric conversion element whose characteristic is different from the characteristic of the first photoelectric conversion element; a second voltage conversion element for converting the output voltage of the second photoelectric conversion element; and a control element for performing maximum power point tracking on the first voltage conversion element and the second voltage conversion element and controlling timing of the voltage conversion elements.

One embodiment of the disclosed invention relates to a photoelectric conversion device which includes a first solar cell; a first voltage conversion element for converting the output voltage of the first solar cell; a second solar cell whose characteristic is different from the characteristic of the first solar cell; a second voltage conversion element for converting the output voltage of the second solar cell; and a control element for performing maximum power point tracking on the first voltage conversion element and the second voltage conversion element and controlling timing of the voltage conversion elements.

One embodiment of the disclosed invention relates to a photoelectric conversion device which includes a first photoelectric conversion element; a first DC-DC converter for converting the output voltage of the first photoelectric conversion element; a second photoelectric conversion element whose characteristic is different from the characteristic of the first photoelectric conversion element; a second DC-DC converter for converting the output voltage of the second photoelectric conversion element; and a control element for performing maximum power point tracking on the first DC-DC converter and the second DC-DC converter and controlling timing of the voltage conversion elements.

One embodiment of the disclosed invention relates to a photoelectric conversion device which includes a first solar cell; a first DC-DC converter for converting the output voltage of the first solar cell; a second solar cell whose characteristic is different from the characteristic of the first solar cell; a second DC-DC converter for converting the output voltage of the second solar cell; and a control element for performing maximum power point tracking on the first DC-DC converter and the second DC-DC converter and controlling timing of the voltage conversion elements.

In one embodiment of the disclosed invention, each of the first photoelectric conversion element and the second photoelectric conversion element is a solar cell. The solar cell is any one of a solar cell including an amorphous silicon film, a solar cell including a single crystal silicon film, a hetero-junction with intrinsic thin-layer (HIT) solar cell, a CIG-based thin film solar cell, a CdTe solar cell, an organic thin film solar cell, and a dye sensitization solar cell.

In one embodiment of the disclosed invention, each of the first solar cell and the second solar cell is any one of a solar cell including an amorphous silicon film, a solar cell including a single crystal silicon film, a hetero junction with intrinsic thin-layer (HIT) solar cell, a CIG-based thin film solar cell, a CdTe solar cell, an organic thin film solar cell, and a dye sensitization solar cell.

According to one embodiment of the disclosed invention, generation of ripple voltage can be suppressed. Further, according to one embodiment of the disclosed invention, the decrease in the output voltage of a photoelectric conversion device can be suppressed.

DETAILED DESCRIPTION OF THE INVENTION

Figure 1:
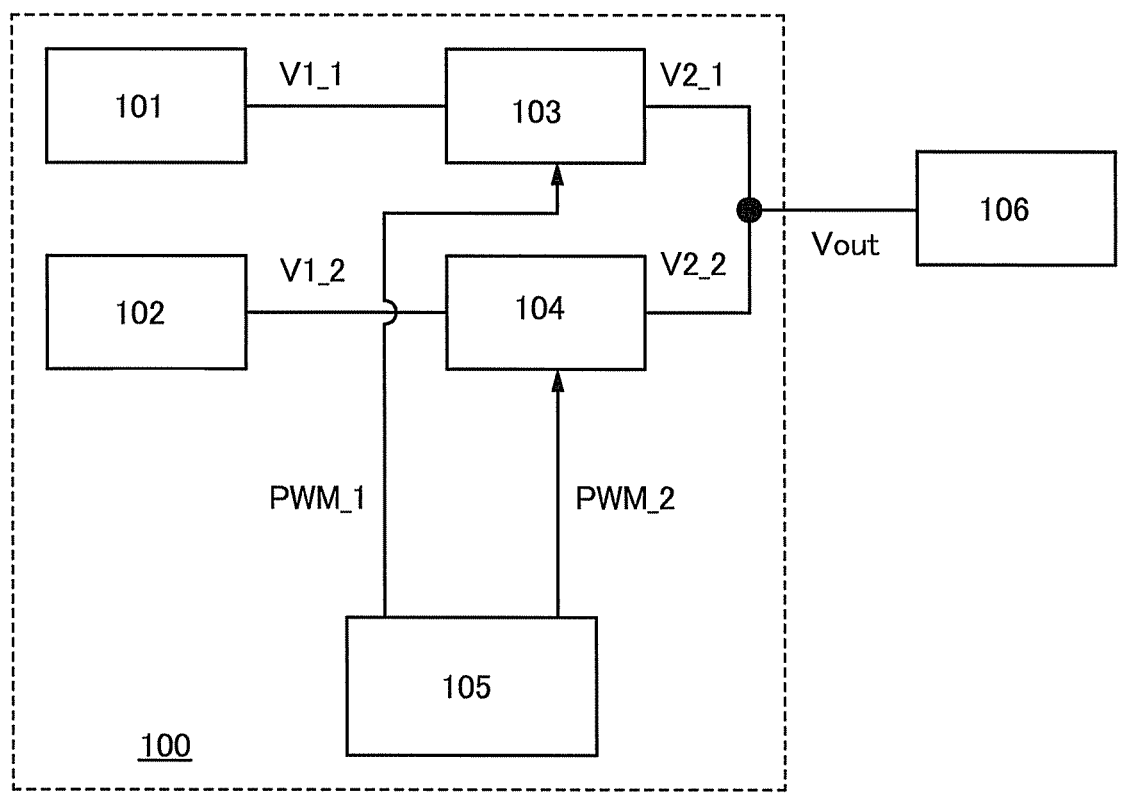
FIG. 1 is a block diagram of a photoelectric conversion device.

Embodiments of the invention disclosed in this specification will be described below with reference to the drawings. Note that the invention disclosed in this specification can be implemented in various different ways. It will be readily appreciated by those skilled in the art that modes and details of the invention disclosed in this specification can be modified in various ways without departing from the spirit and scope of the invention disclosed in this specification. The invention disclosed in this specification therefore should not construed as being limited to the description of the embodiments. Note that in structures described below, the same portions or portions having similar functions are denoted by the same reference numerals, and description thereof is not repeated.

Embodiment 1

Photoelectric conversion devices in this embodiment are described with reference to FIG. 1, FIGS. 2A and 2B, FIGS. 3A and 3B, FIGS. 4A and 4B, FIGS. 5A and 5B, FIGS. 6A and 6B, FIG. 7, FIGS. 8A and 8B, FIGS. 9A and 9B, FIG. 10, FIG. 11, FIGS. 12A and 12B, FIG. 13, FIG. 15, FIGS. 17A and 17B, FIGS. 18A to 18E, FIGS. 19A to 19C, and FIGS. 20A to 20C.

FIG. 1 illustrates a photoelectric conversion device 100 in this embodiment. The photoelectric conversion device 100 illustrated in FIG. 1 includes a first photoelectric conversion element 101, a first voltage conversion element 103 connected to the first photoelectric conversion element 101, a second photoelectric conversion element 102, a second voltage conversion element 104 connected to the second photoelectric conversion element 102, and a control element 105. From the control element 105, a first PWM signal PWM_1 used for controlling the first voltage conversion element 103 and a second PWM signal PWM_2 used for controlling the second voltage conversion element 104 are input.

The control element 105 performs maximum power point tracking (MPPT) on the first voltage conversion element 103 and the second voltage conversion element 104 so that the maximum electric power of the first photoelectric conversion element 101 and the maximum electric power of the second photoelectric conversion element 102 are obtained. The first voltage conversion element 103 and the second voltage conversion element 104 are controlled with the first PWM signal PWM_1 and the second PWM signal PWM_2, respectively.

Voltage V1_1 generated in the first photoelectric conversion element 101 is converted into voltage V2_1 by the first voltage conversion element 103. Voltage V1_2 generated in the second photoelectric conversion element 102 is converted into voltage V2_2 by the second voltage conversion element 104. The voltage V2_1 output from the first voltage conversion element 103 and the voltage V2_2 output from the second voltage conversion element 104 are added and output as output voltage Vout outside the photoelectric conversion device 100.

Note that an external circuit 106 formed using a battery, an inverter, a voltage stabilization circuit, or the like may be connected to the photoelectric conversion device 100.

The first voltage conversion element 103 and the second voltage conversion element 104 in this embodiment are described with reference to FIGS. 2A and 2B. In this embodiment, as an example of each of the first voltage conversion element 103 and the second voltage conversion element 104, a DC-DC converter that converts the level of DC voltage into a different DC voltage level.

Figure 2A:
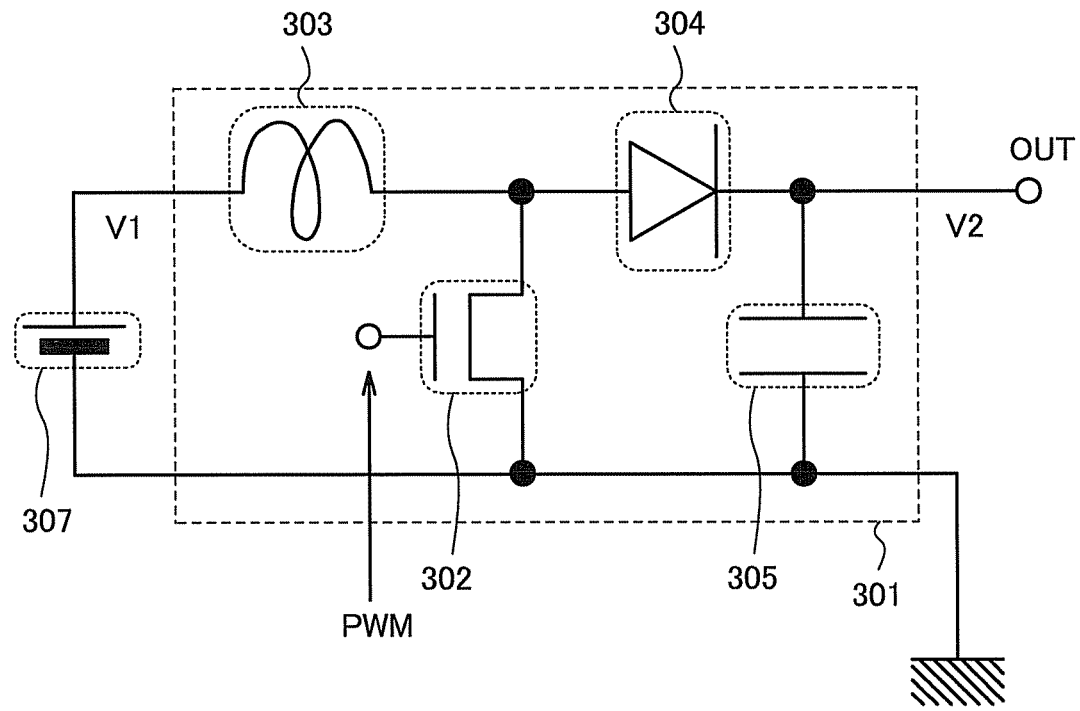
FIGS. 2A and 2B are circuit diagrams of voltage conversion elements.

A voltage conversion element 301 illustrated in FIG. 2A is a step-up circuit (a step-up DC-DC converter) which includes a transistor 302, a coil 303, a diode 304, and a capacitor 305. The voltage conversion element 301 is an element which converts the output voltage of a photoelectric conversion element 307. The photoelectric conversion element 307 corresponds to either one or both the first photoelectric conversion element 101 and the second photoelectric conversion element 102.

One terminal of the coil 303 is electrically connected to an electrode provided on a p-type semiconductor layer side of the photoelectric conversion element 307. The other terminal of the coil 303 is electrically connected to one of a source and a drain of the transistor 302. The one of the source and the drain of the transistor 302 is electrically connected to the other terminal of the coil 303 and an input terminal of the diode 304. The other of the source and the drain of the transistor 302 is electrically connected to an electrode provided on an n-type semiconductor layer side of the photoelectric conversion element 307 and one terminal of the capacitor 305. The other terminal of the capacitor 305 is electrically connected to an output terminal of the diode 304 and an output terminal OUT. Note that the electrode provided on the n-type semiconductor layer side of the photoelectric conversion element 307, the other of the source and the drain of the transistor 302, and the one terminal of the capacitor 305 are grounded.

Note that a gate of the transistor is the entire gate electrode and gate wiring or part thereof. The gate wiring is a wiring for electrically connecting at least one gate electrode of a transistor to a different electrode or a different wiring.

A source of the transistor is the entire source region, source electrode, and source wiring or part thereof. The source region is a region in a semiconductor layer, where a resistance value is smaller than that of a channel formation region. The source electrode is part of a conductive layer that is connected to the source region. The source wiring is a wiring for electrically connecting at least one source electrode of a transistor to a different electrode or a different wiring.

A drain of the transistor is the entire drain region, drain electrode, and drain wiring or part thereof. The drain region is a region in a semiconductor layer, where a resistance value is smaller than that of a channel formation region. The drain electrode is part of a conductive layer that is connected to the drain region. The drain wiring is a wiring for electrically connecting at least one drain electrode of a transistor to a different electrode or a different wiring.

Further, a source and a drain of a transistor may be interchanged depending on the structure, the operating condition, or the like of the transistor; thus, it is difficult to define which is a source or a drain. Thus, in this document (the specification, the claims, the drawings, or the like), one of them is referred to as one of the source and the drain, and the other is referred to as the other of the source and the drain.

The transistor 302 functions as a switching element. In addition, a gate of the transistor 302 is connected to a control circuit of the voltage conversion element 301. With a signal PWM output from the control circuit of the voltage conversion element 301, the transistor 302 is turned on or off. When an H-level (high-level) signal PWM is input, the transistor 302 is turned on. When an L-level (low-level) signal PWM is input, the transistor 302 is turned off.

When the transistor 302 that is a switching element is on, excitation energy is stored in the coil 303 with current flowing to the coil 303.

When the transistor 302 is turned off, the excitation energy stored in the coil 303 is released. Voltage that is generated by the excitation energy released from the coil 303 is added to voltage V1 to be V2. Thus, the voltage conversion element 301 functions as a step-up circuit.

That is, as the time when the transistor 302 is on becomes longer, the amount of excitation energy stored increases. Thus, as the time when the transistor 302 is on becomes longer, the level of the voltage that is added to the voltage V1 increases, then the voltage V2 increases. Accordingly, it can be said that as the time during which the transistor 302 is on becomes longer, the level of the voltage V2 output from the voltage conversion element 301 increases.

The time when the transistor 302 that is a switching element is on is referred to as Ton, and the time when the transistor 302 is off is referred to as Toff. The level of the voltage V2 output is expressed as Formula 1.

$$V2 = V1 \times (Ton + Toff) / Toff \quad \text{[Formula 1]}$$

As the time Ton when the transistor 302 is on becomes longer and the amount of energy stored in the coil 303 becomes larger, higher electric power can be obtained.

Note that in this embodiment, for example, a field-effect transistor can be used as the transistor 302.

A field-effect transistor includes at least a gate, a source, and a drain. As the field-effect transistor, a thin film transistor (also referred to as a TFT) can be used, for example. In addition, the field-effect transistor can have a top-gate structure or a bottom-gate structure, for example. Further, the field-effect transistor can have n-type conductivity.

In addition, as the field-effect transistor in this embodiment, for example, a transistor which includes an oxide semiconductor film functioning as a channel formation region is used. Note that the hydrogen concentration in the channel formation region is $5 \times 10^{19}$ atoms/cm$^3$ or lower, preferably $5 \times 10^{18}$ atoms/cm$^3$ or lower, more preferably $5 \times 10^{17}$ atoms/cm$^3$ or lower. The hydrogen concentration is measured by secondary ion mass spectroscopy (SIMS), for example. The carrier concentration of the transistor is $1 \times 10^{14}$/cm$^3$ or lower, preferably $1 \times 10^{12}$/cm$^3$ or lower.

In this embodiment, a coiled wiring formed over a substrate can be used as the coil 303.

In this embodiment, a Schottky-barrier diode can be used as the diode 304, for example.

In this embodiment, a capacitor including a first electrode, a second electrode, and a dielectric can be used as the capacitor 305, for example.

Figure 2B:
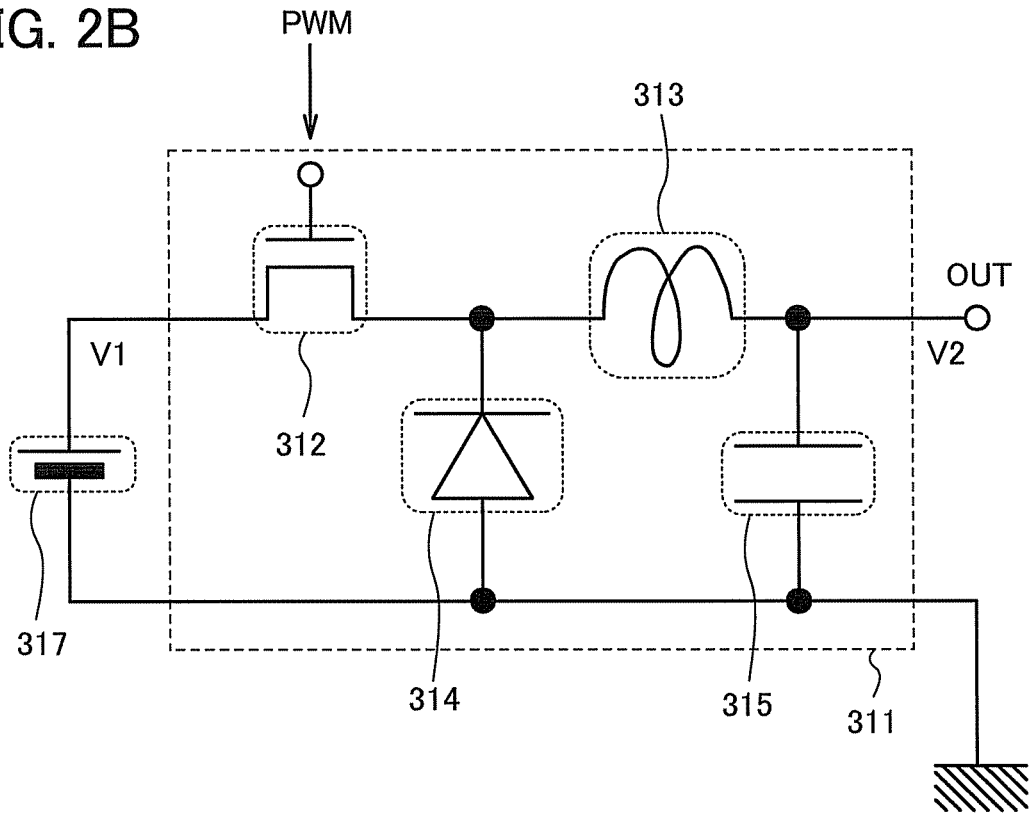

A voltage conversion element 311 illustrated in FIG. 2B is a step-down circuit (a step-down DC-DC converter) which includes a transistor 312, a coil 313, a diode 314, and a capacitor 315. The voltage conversion element 311 is an element which converts the output voltage of a photoelectric conversion element 317. The photoelectric conversion element 317 corresponds to either one or both the first photoelectric conversion element 101 and the second photoelectric conversion element 102.

One of a source and a drain of the transistor 312 is electrically connected to an electrode provided on a p-type semiconductor layer side of the photoelectric conversion element 317. The other of the source and the drain of the transistor 312 is electrically connected to an output terminal of the diode 314 and one terminal of the coil 313. An input terminal of the diode 314 is electrically connected to an electrode provided on an n-type semiconductor layer side of the photoelectric conversion element 317 and one terminal of the capacitor 315. The output terminal of the diode 314 is electrically connected to the other of the source and the drain of the transistor 312 and the one terminal of the coil 313. The one terminal of the coil 313 is electrically connected to the other of the source and the drain of the transistor 312 and the output terminal of the diode 314. The other terminal of the coil 313 is electrically connected to the other terminal of the capacitor 315 and the output terminal OUT. Note that the electrode provided on the n-type semiconductor layer side of the photoelectric conversion element 317, the input terminal of the diode 314, and the one terminal of the capacitor 315 are grounded.

The transistor 312 functions as a switching element. In addition, a gate of the transistor 312 is connected to a control circuit of the voltage conversion element 311. With a signal PWM output from the control circuit of the voltage conversion element 311, the transistor 312 is turned on or off.

When the transistor 312 that is a switching element is on, excitation energy is stored in the coil 313 with current in the step-down circuit.

When the transistor 312 is turned off, the coil 313 generates electromotive force so that current is kept and brings the diode 314 into an on state. The level of the voltage decreases to be V2 when the current flows through the diode 314. The level of the voltage V2 becomes lower than that of the voltage V1; thus, the voltage conversion element 311 functions as a step-down circuit.

Note that in this embodiment, for example, a field-effect transistor can be used as the transistor 312.

In this embodiment, a coiled wiring formed over a substrate can be used as the coil 313.

In this embodiment, a Schottky-barrier diode can be used as the diode 314, for example.

In this embodiment, a capacitor including a first electrode, a second electrode, and a dielectric can be used as the capacitor 315, for example.

A method for controlling timing of the first voltage conversion element and the second voltage conversion element is described below.

Figure 20A:
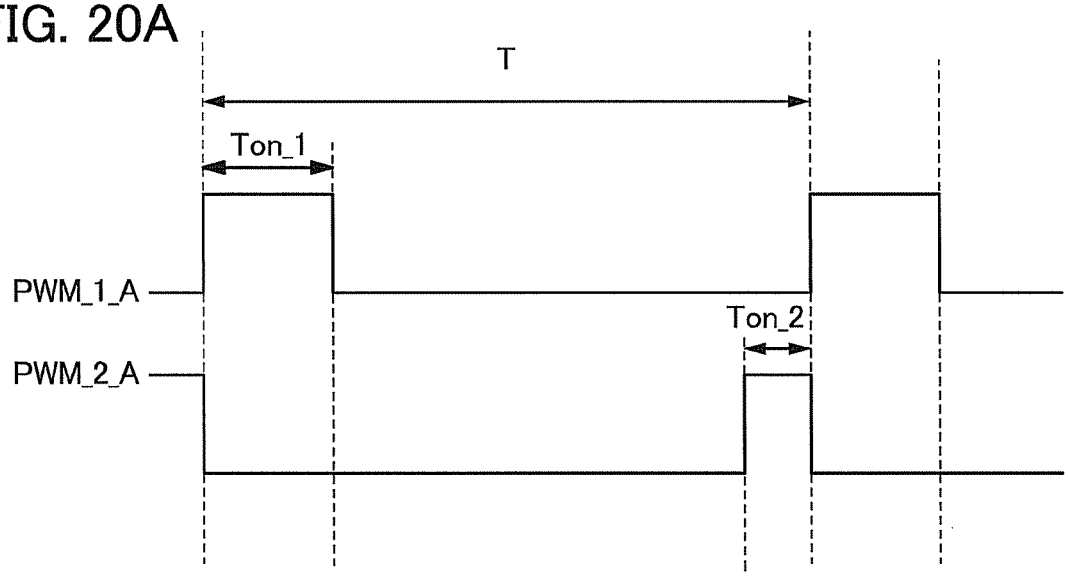
FIGS. 20A to 20C are timing charts of PWM signals.
Figure 20B:
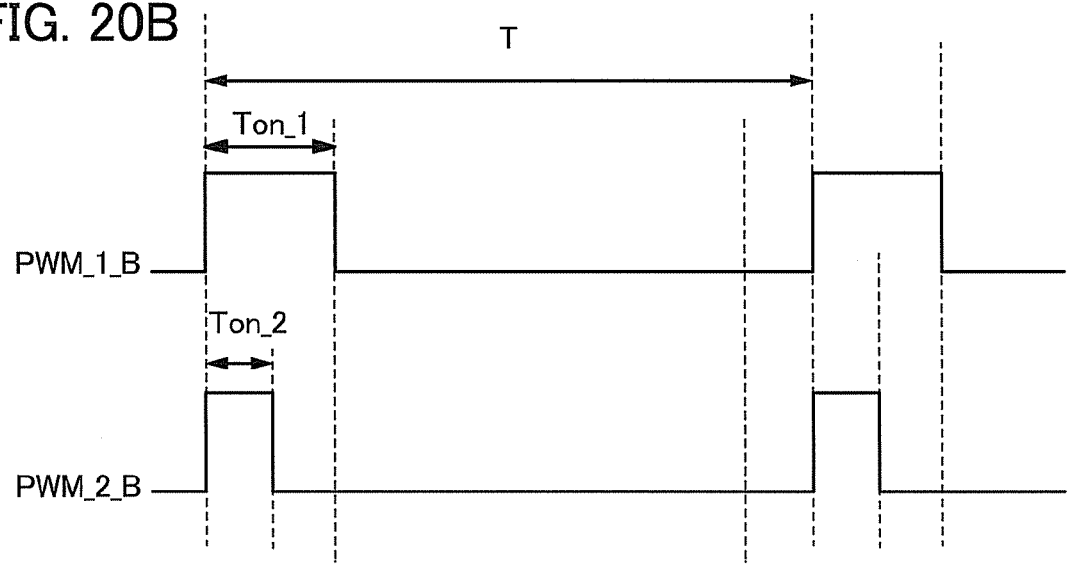

First, FIGS. 20A and 20B are timing charts of PWM signals PWM_1_A and PWM_1_B which are input to the first voltage conversion element 103 so as to be used for controlling the output of the first voltage conversion element 103 and PWM signals PWM_2_A and PWM_2_B which are input to the second voltage conversion element 104 so as to be used for controlling the output of the second voltage conversion element 104.

Figure 20C:
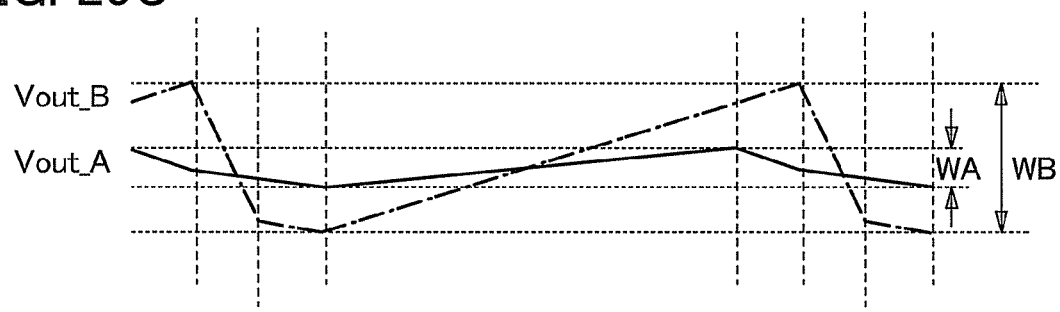

Note that an example is described in which the level of the PWM signal PWM_1_A becomes high at timing of when the level of the PWM signal PWM_2_A becomes low in the PWM signals PWM_1_A and PWM_2_A. In other words, an example is described in which time Ton_1 when the level of the PWM signal PWM_1_A is high and time Ton_2 when the level of the PWM signal PWM_2_A is high do not overlap with each other (see FIG. 20A). FIG. 20C illustrates output voltage Vout_A in that case.

In contrast, an example is described in which the time Ton_1 when the level of the PWM signal PWM_1_B is high and the time Ton_2 during which the level of the PWM signal PWM_2_B is high overlap with each other in the PWM signals PWM_1_B and PWM_2_B (see FIG. 20B). FIG. 20C illustrates output voltage Vout_B in that case.

The time Ton_1 during which the level of the PWM signal PWM_1_A is high and the time Ton_2 when the level of the PWM signal PWM_2_A is high do not overlap with each other. Thus, time when the level of the voltage V2_1 output from the first voltage conversion element 103 is raised and time when the level of the voltage V2_2 output from the second voltage conversion element 104 is raised do not overlap with each other.

Since the time when the level of the voltage V2_1 is raised and the time when the level of the voltage V2_2 is raised do not overlap with each other, the fluctuation range WA of the output voltage Vout_A which is the sum of the voltage V2_1 and the voltage V2_2 decreases.

In contrast, the time Ton_1 when the level of the PWM signal PWM_1_B is high and the time Ton_2 when the level of the PWM signal PWM_2_B is high partly overlap with each other. Thus, the time when the level of the voltage V2_1 output from the first voltage conversion element 103 is raised and the time when the level of the voltage V2_2 output from the second voltage conversion element 104 is raised partly overlap with each other.

Since the time when the level of the voltage V2_1 is raised and the time when the level of the voltage V2_2 is raised partly overlap with each other, the fluctuation range WB of the output voltage Vout_B which is the sum of the voltage V2_1 and the voltage V2_2 is larger than the fluctuation range WA of the output voltage Vout_A.

In other words, when the time Ton_1 when the level of the PWM signal PWM_1_B is high and the time Ton_2 when the level of the PWM signal PWM_2_B is high overlap with each other, ripple voltage increases.

Thus, in order to suppress generation of ripple voltage, it is preferable that the time Ton_1 when the level of the PWM signal PWM_1 is high and the time Ton_2 when the level of the PWM signal PWM_2 is high do not overlap with each other.

A variety of examples of the PWM signals PWM_1 and PWM_2 are described below.

Figure 3A:
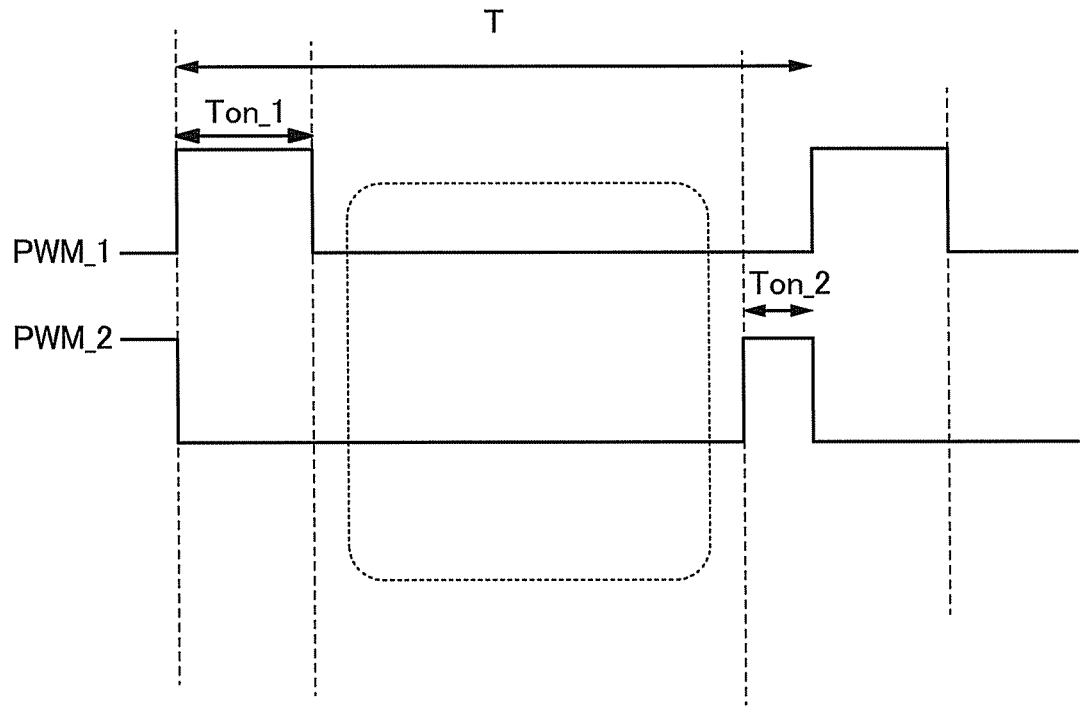
FIGS. 3A and 3B are timing charts of PWM signals.
Figure 3B:
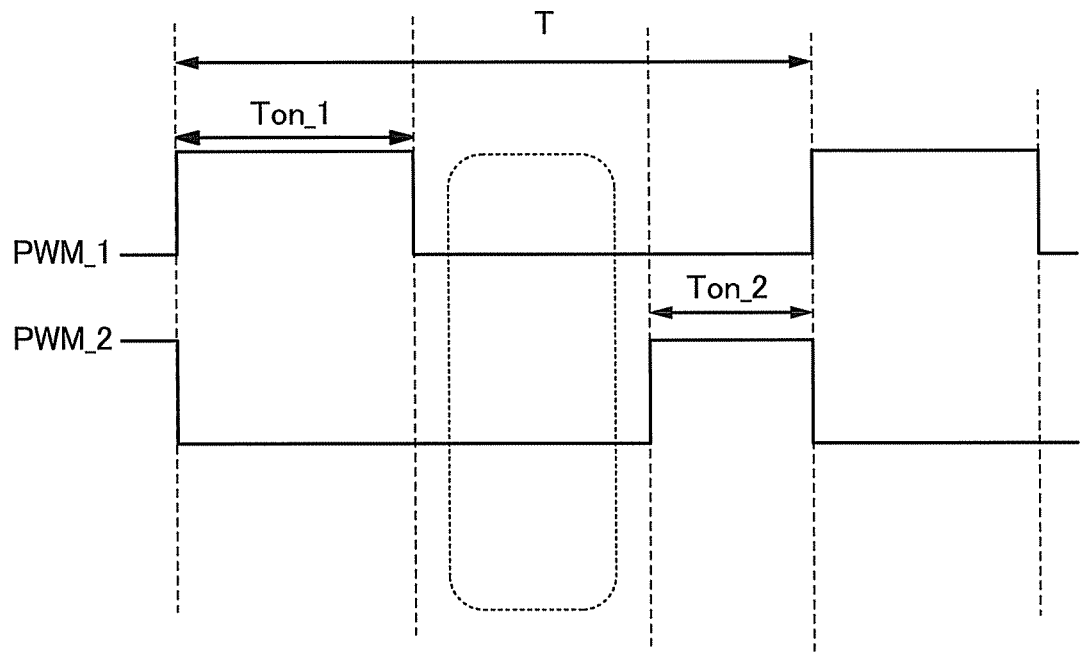

FIGS. 3A and 3B are timing charts of the PWM signal PWM_1 which is input to the first voltage conversion element 103 so as to be used for controlling the output of the first voltage conversion element 103 and the PWM signal PWM_2 which is input to the second voltage conversion element 104 so as to be used for controlling the output of the second voltage conversion element 104.

Here, in the two step-up circuits which are connected to the first photoelectric conversion element 101 and the second photoelectric conversion element 102 illustrated in FIG. 1, the cycle T of the PWM signal PWM_1 and the cycle T of the PWM signal PWM_2 preferably have the same length. When the cycle T of the PWM signal PWM_1 and the cycle T of the PWM signal PWM_2 have the same length, the size of the control element 105 can be made small. If the size of the control element 105 can be made small, power consumed in the photoelectric conversion device 100 can be reduced. If the power consumed in the photoelectric conversion device 100 can be reduced, the efficiency of the photoelectric conversion device 100 can be improved.

In FIG. 3A, Ton_1 of the PWM signal PWM_1 which is input to the first voltage conversion element 103 and Ton_2 of the PWM signal PWM_2 which is input to the second voltage conversion element 104 are controlled so as not to overlap with each other. Note that a region surrounded by a dotted line indicates time when Ton_1 of the PWM signal PWM_1 and Ton_2 of the PWM signal PWM_2 do not overlap with each other. Note that Ton_1 is time when the transistor 302 in the first voltage conversion element 103 is on, and Ton_2 is time when the transistor 302 in the second voltage conversion element 104 is on.

Thus, the fluctuation range of the output voltage Vout which is the sum of the voltage V2_1 output from the first voltage conversion element 103 and the voltage V2_2 output from the second voltage conversion element 104 decreases. That is, generation of ripple voltage in the photoelectric conversion device 100 illustrated in FIG. 1 is suppressed.

Further, FIG. 3B is a timing chart at the time when maximum power point tracking (MPPT) is performed on the first voltage conversion element 103 and the second voltage conversion element 104 by the control element 105 illustrated in FIG. 1. Note that FIG. 3B is a timing chart at the time when the intensity of sunlight is lower than that in FIG. 3A. When the intensity of sunlight is changed, the maximum power point of a solar cell is changed. Thus, the length of Ton is changed by MPPT.

Ton_1 illustrated in FIG. 3B is longer than Ton_1 illustrated in FIG. 3A. Ton_2 illustrated in FIG. 3B is longer than Ton_2 illustrated in FIG. 3A. The intensity of sunlight in FIG. 3B is lower than that in FIG. 3A; thus, the output voltage Vout whose level is made higher is obtained when time to convert voltage, in this embodiment, time to raise voltage is made longer.

In FIG. 3B, Ton_1 of the PWM signal PWM_1 and Ton_2 of the PWM signal PWM_2 are made longer than those in FIG. 3A and are controlled so as not to overlap with each other.

Thus, the fluctuation range of the output voltage Vout which is the sum of the voltage V2_1 output from the first voltage conversion element 103 and the voltage V2_2 output from the second voltage conversion element 104 decreases. That is, generation of ripple voltage in the photoelectric conversion device 100 illustrated in FIG. 1 is suppressed.

Figure 4A:
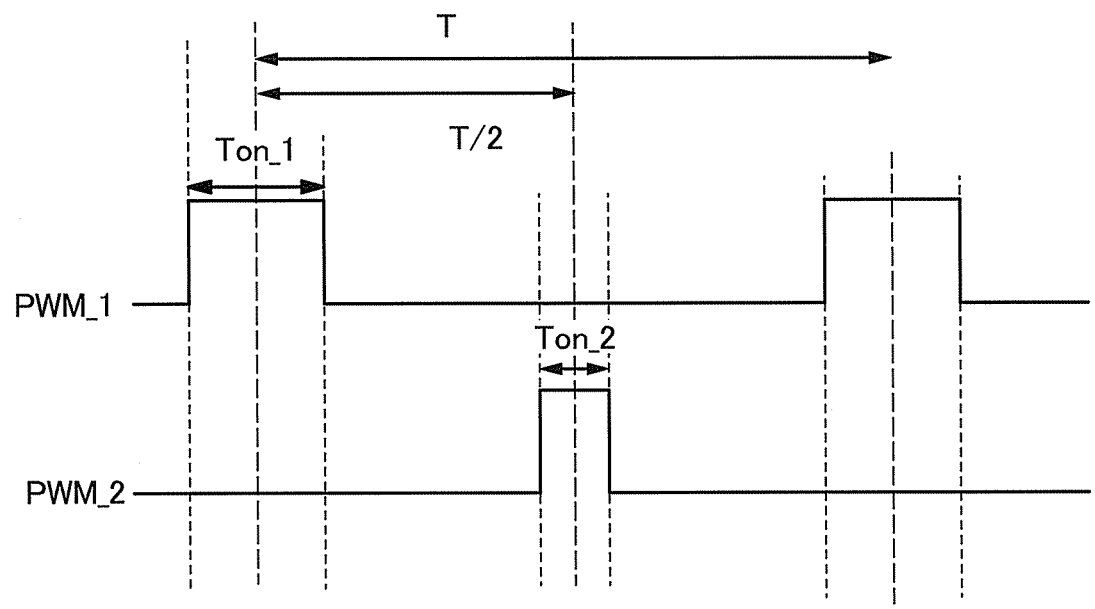
FIGS. 4A and 4B are timing charts of PWM signals.
Figure 4B:
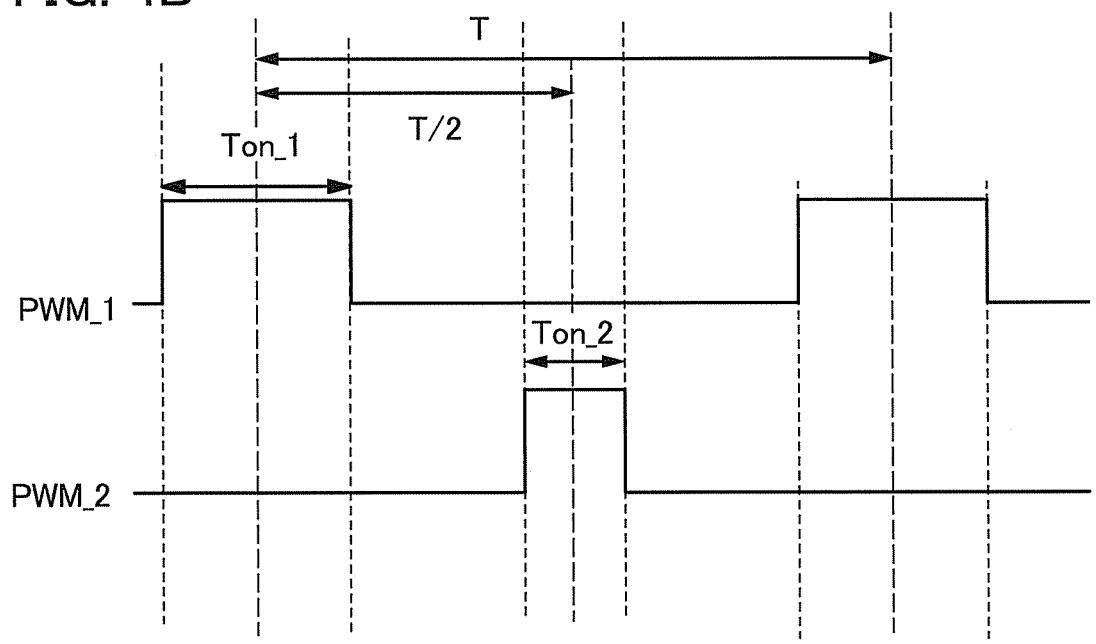

FIGS. 4A and 4B illustrate examples of timing charts which are different from those in FIGS. 3A and 3B.

FIG. 4A illustrates an example in which length from an intermediate point at which the level of the PWM signal PWM_1 is high to an intermediate point at which the level of the PWM signal PWM_2 is high is controlled so as to be half the cycle T.

FIG. 4B is a timing chart at the time when the intensity of sunlight is lower than that in FIG. 4A. When the intensity of sunlight is changed, the maximum power point of a solar cell is changed. Thus, the length of Ton is changed by MPPT.

In FIG. 4B, Ton_1 of the PWM signal PWM_1 and Ton_2 of the PWM signal PWM_2 are made longer than those in FIG. 4A and are controlled so as not to overlap with each other.

Thus, the fluctuation range of the output voltage Vout which is the sum of the voltage V2_1 output from the first voltage conversion element 103 and the voltage V2_2 output from the second voltage conversion element 104 decreases. That is, generation of ripple voltage in the photoelectric conversion device 100 illustrated in FIG. 1 is suppressed.

Figure 5A:
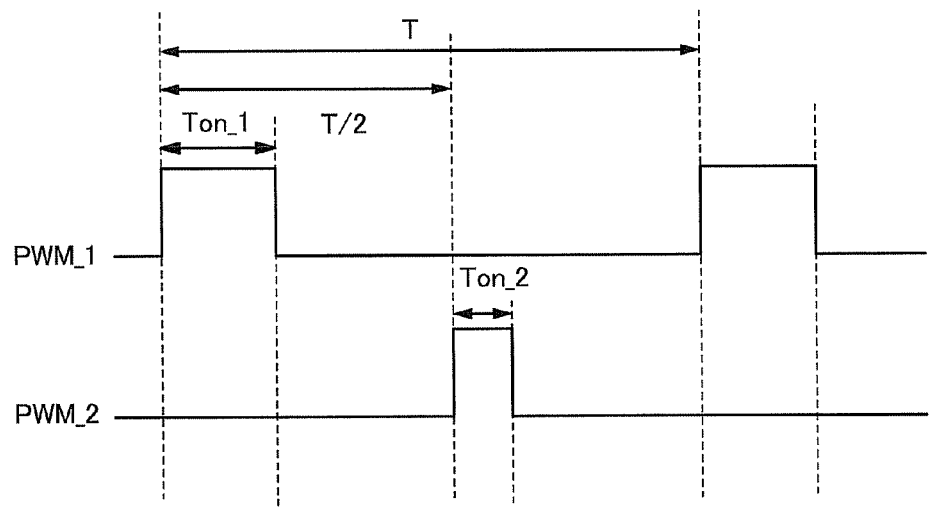
FIGS. 5A and 5B are timing charts of PWM signals.
Figure 5B:
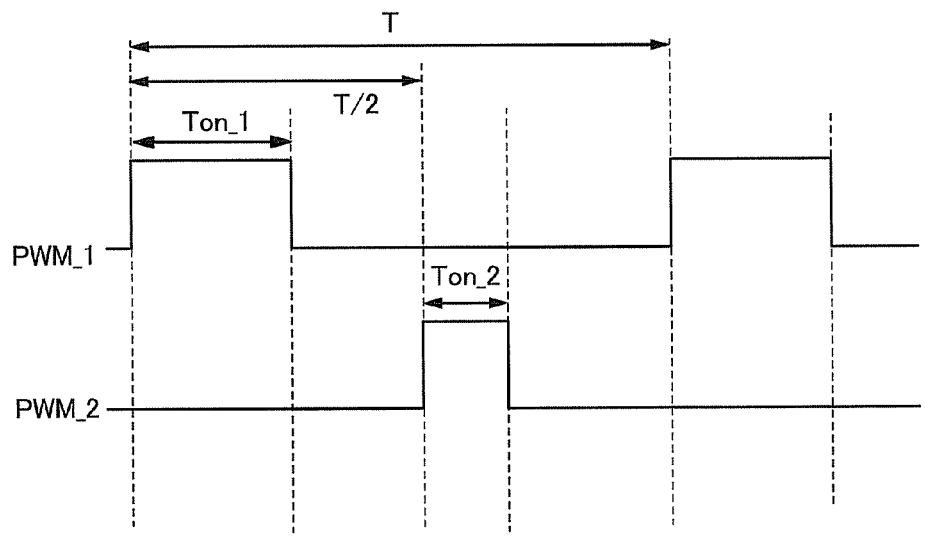

FIGS. 5A and 5B illustrate examples of timing charts which are different from those in FIGS. 3A and 3B.

FIG. 5A illustrates an example in which length from the time when the level of the PWM signal PWM_1 becomes high to the time when the level of the PWM signal PWM_2 becomes high is controlled so as to be half the cycle T.

FIG. 5B is a timing chart at the time when the intensity of sunlight is lower than that in FIG. 5A. When the intensity of sunlight is changed, the maximum power point of a solar cell is changed. Thus, the length of Ton is changed by MPPT.

In FIG. 5B, Ton_1 of the PWM signal PWM_1 and Ton_2 of the PWM signal PWM_2 are made longer than those in FIG. 5A and are controlled so as not to overlap with each other.

Thus, the fluctuation range of the output voltage Vout which is the sum of the voltage V2_1 output from the first voltage conversion element 103 and the voltage V2_2 output from the second voltage conversion element 104 decreases. That is, generation of ripple voltage in the photoelectric conversion device 100 illustrated in FIG. 1 is suppressed.

Figure 6A:
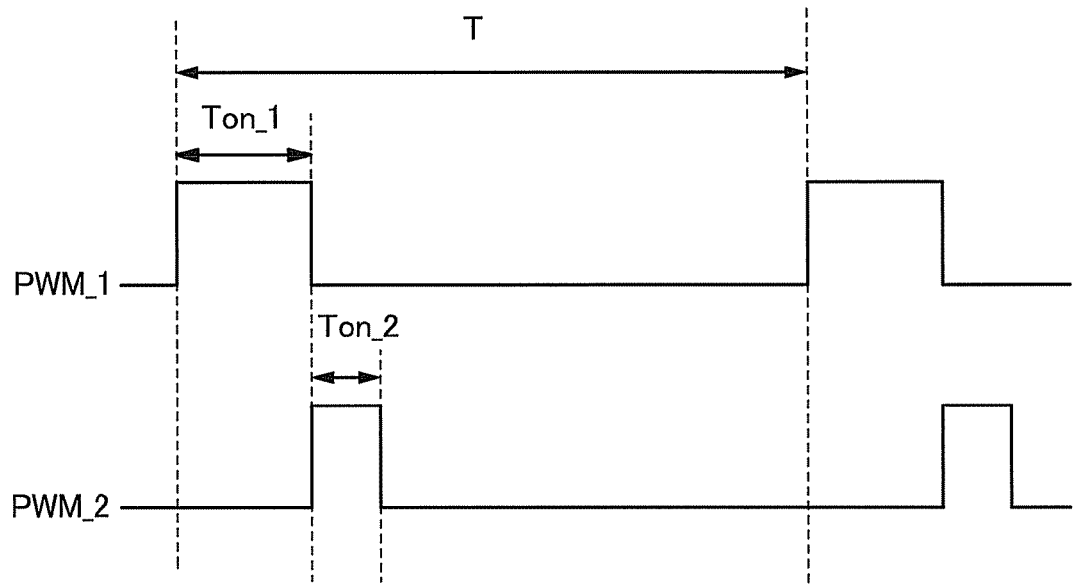
FIGS. 6A and 6B are timing charts of PWM signals.
Figure 6B:
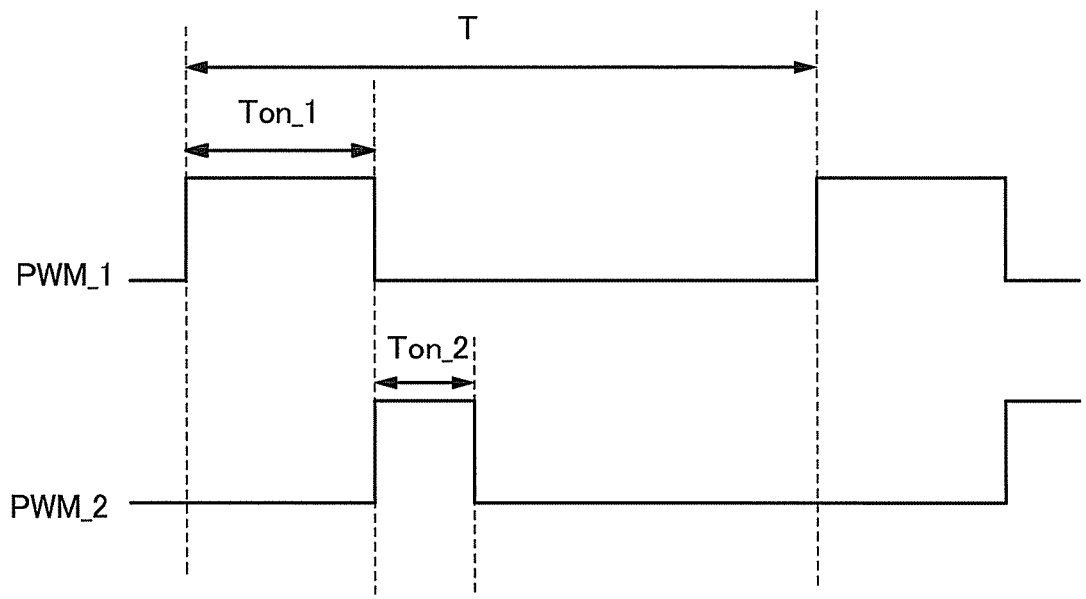

FIGS. 6A and 6B illustrate examples of timing charts which are different from those in FIGS. 3A and 3B.

FIGS. 6A and 6B illustrate examples in which the level of the PWM signal PWM_2 becomes high at timing of when the level of the PWM signal PWM_1 becomes low.

FIG. 6B is a timing chart at the time when the intensity of sunlight is lower than that in FIG. 6A. When the intensity of sunlight is changed, the maximum power point of a solar cell is changed. Thus, the length of Ton is changed by MPPT.

In FIG. 6B, Ton_1 of the PWM signal PWM_1 and Ton_2 of the PWM signal PWM_2 are made longer than those in FIG. 6A and are controlled so as not to overlap with each other.

Thus, the fluctuation range of the output voltage Vout which is the sum of the voltage V2_1 output from the first voltage conversion element 103 and the voltage V2_2 output from the second voltage conversion element 104 decreases. That is, generation of ripple voltage in the photoelectric conversion device 100 illustrated in FIG. 1 is suppressed.

Figure 7:
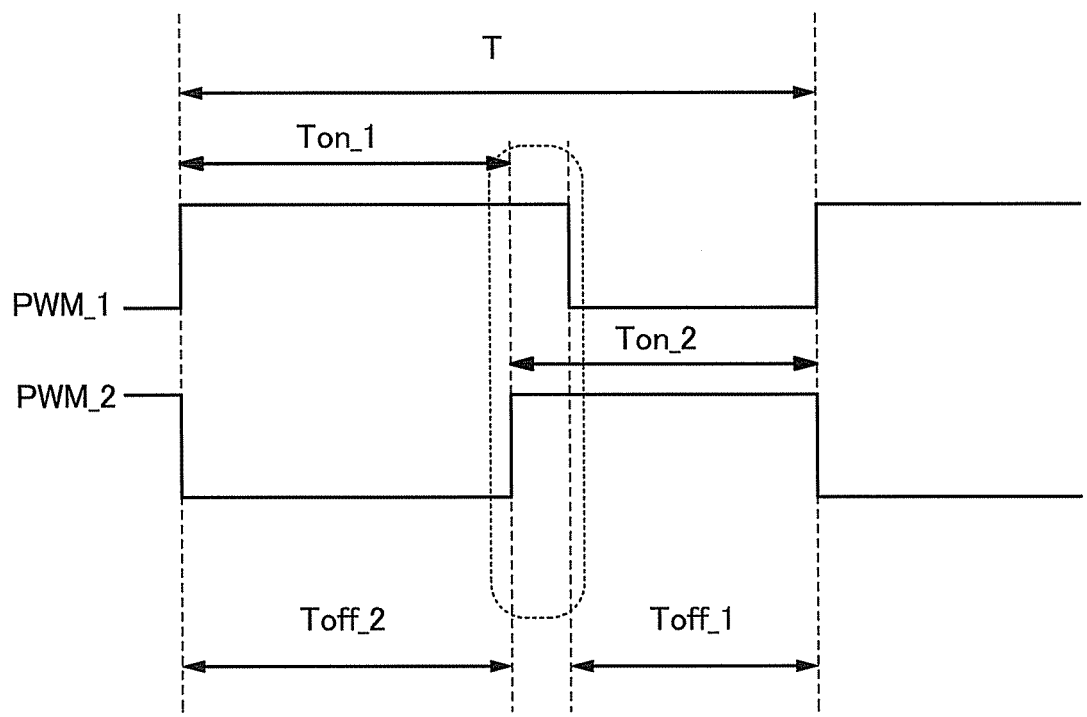
FIG. 7 is a timing chart of PWM signals.

Ton_1 of the PWM signal PWM_1 and Ton_2 of the PWM signal PWM_2 might be made longer by MPPT. FIG. 7 illustrates the case where the sum of Ton_1 and Ton_2 is longer than the cycle T and Ton_1 and Ton_2 overlap with each other.

As described above, in order to suppress generation of ripple voltage, it is preferable that Ton_1 and Ton_2 do not overlap with each other. In the case where Ton_1 and Ton_2 overlap with each other, the PWM signal PWM_1 and the PWM signal PWM_2 are preferably controlled so that Toff_1 and Toff_2 do not overlap with each other. Toff_1 is time when the transistor 302 in the first voltage conversion element 103 is off, and Toff_2 is time when the transistor 302 in the second voltage conversion element 104 is off.

When the PWM signal PWM_1 and the PWM signal PWM_2 are controlled so that Toff_1 and Toff_2 do not overlap with each other, times when electric power is not converted do not overlap with each other as in the case where Ton_1 and Ton_2 do not overlap with each other. Thus, generation of ripple voltage can be suppressed.

FIGS. 3A and 3B, FIGS. 4A and 4B, FIGS. 5A and 5B, FIGS. 6A and 6B, and FIG. 7 each illustrate the timing chart at the time when two sets of photoelectric conversion elements and voltage conversion elements are used. However, the number of sets of photoelectric conversion elements and voltage conversion elements is not limited two. The number of sets of photoelectric conversion elements and voltage conversion elements may be three or more.

Figure 15:
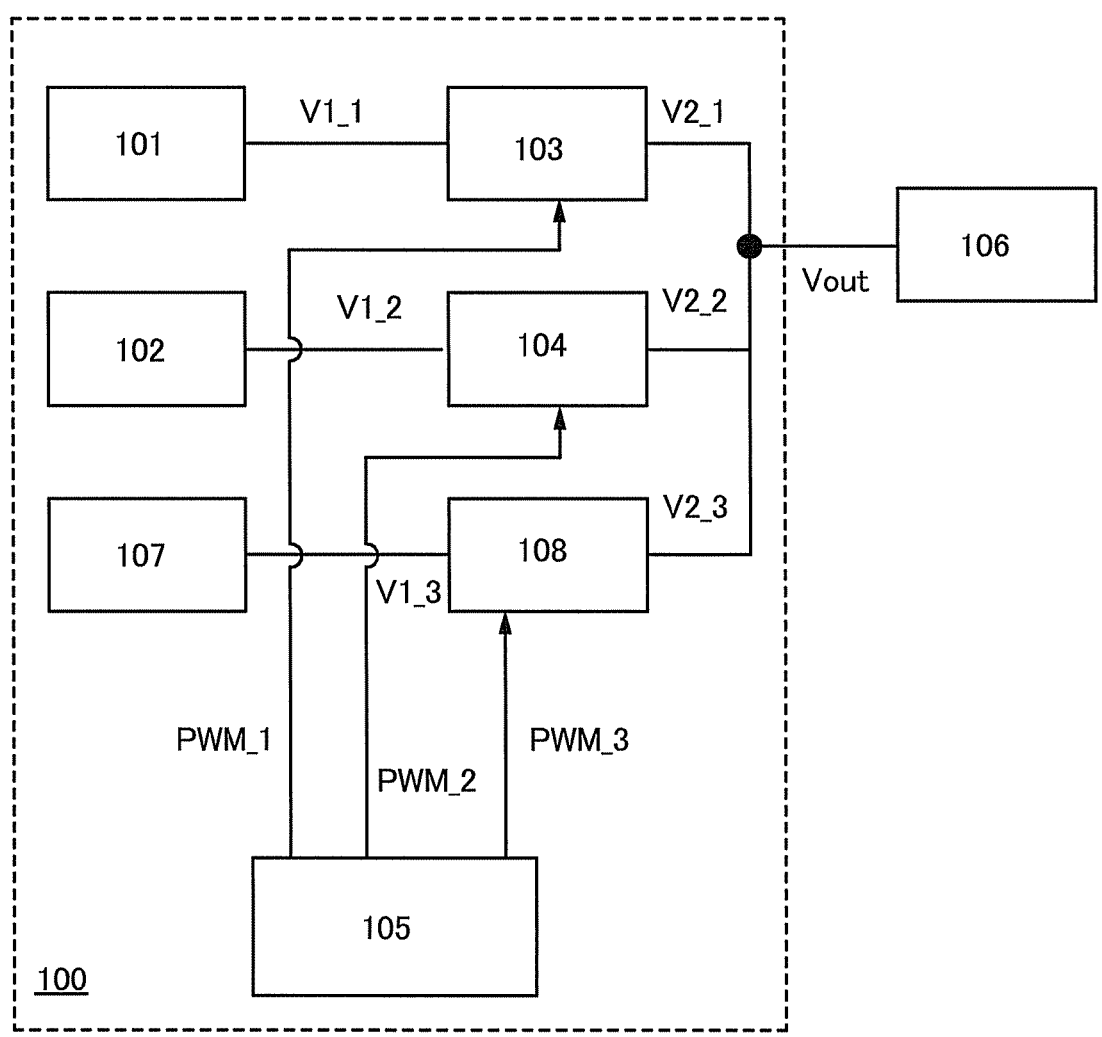
FIG. 15 is a block diagram of a photoelectric conversion device.

FIG. 15 illustrates the photoelectric conversion device 100 which includes three sets of photoelectric conversion elements and voltage conversion elements.

The photoelectric conversion device 100 illustrated in FIG. 15 includes the first photoelectric conversion element 101, the first voltage conversion element 103 connected to the first photoelectric conversion element 101, the second photoelectric conversion element 102, the second voltage conversion element 104 connected to the second photoelectric conversion element 102, a third photoelectric conversion element 107, a third voltage conversion element 108 connected to the third photoelectric conversion element 107, and the control element 105. From the control element 105, the first PWM signal PWM_1 used for controlling the first voltage conversion element 103, the second PWM signal PWM_2 used for controlling the second voltage conversion element 104, and a third PWM signal PWM_3 used for controlling the third voltage conversion element 108 are input.

The control element 105 controls the first voltage conversion element 103, the second voltage conversion element 104, and the third voltage conversion element 108 so that the maximum electric power of the first photoelectric conversion element 101, the maximum electric power of the second photoelectric conversion element 102, and the maximum electric power of the third photoelectric conversion element 107 are obtained. The first voltage conversion element 103, the second voltage conversion element 104, and the third voltage conversion element 108 are controlled with the first PWM signal PWM_1, the second PWM signal PWM_2, and the third PWM signal PWM_3, respectively.

The voltage V1_1 generated in the first photoelectric conversion element 101 is converted into the voltage V2_1 by the first voltage conversion element 103. The voltage V1_2 generated in the second photoelectric conversion element 102 is converted into the voltage V2_2 by the second voltage conversion element 104. Voltage V1_3 generated in the third photoelectric conversion element 107 is converted into voltage V2_3 by the third voltage conversion element 108.

The voltage V2_1 output from the first voltage conversion element 103, the voltage V2_2 output from the second voltage conversion element 104, and the voltage V2_3 output from the third voltage conversion element 108 are added and output as the output voltage Vout outside the photoelectric conversion device 100.

Note that the external circuit 106 formed using a battery, an inverter, a voltage stabilization circuit, or the like may be connected to the photoelectric conversion device 100.

Figure 8A:
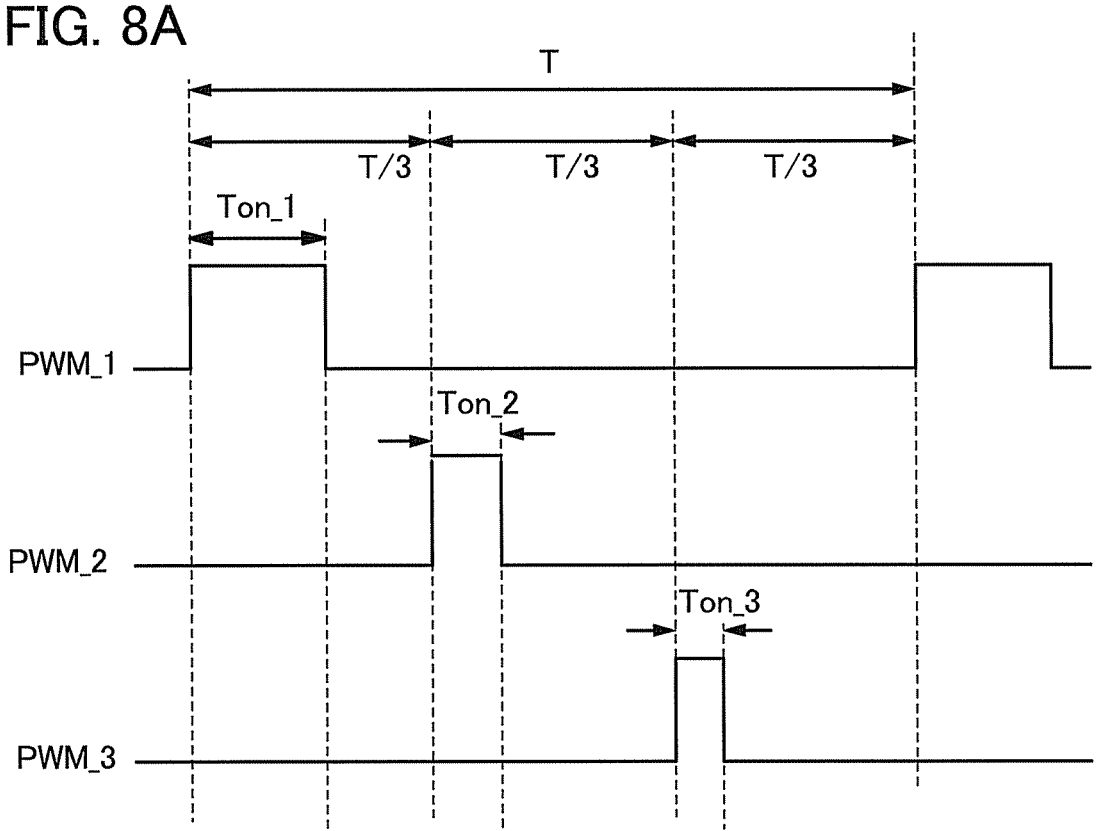
FIGS. 8A and 8B are timing charts of PWM signals.
Figure 8B:
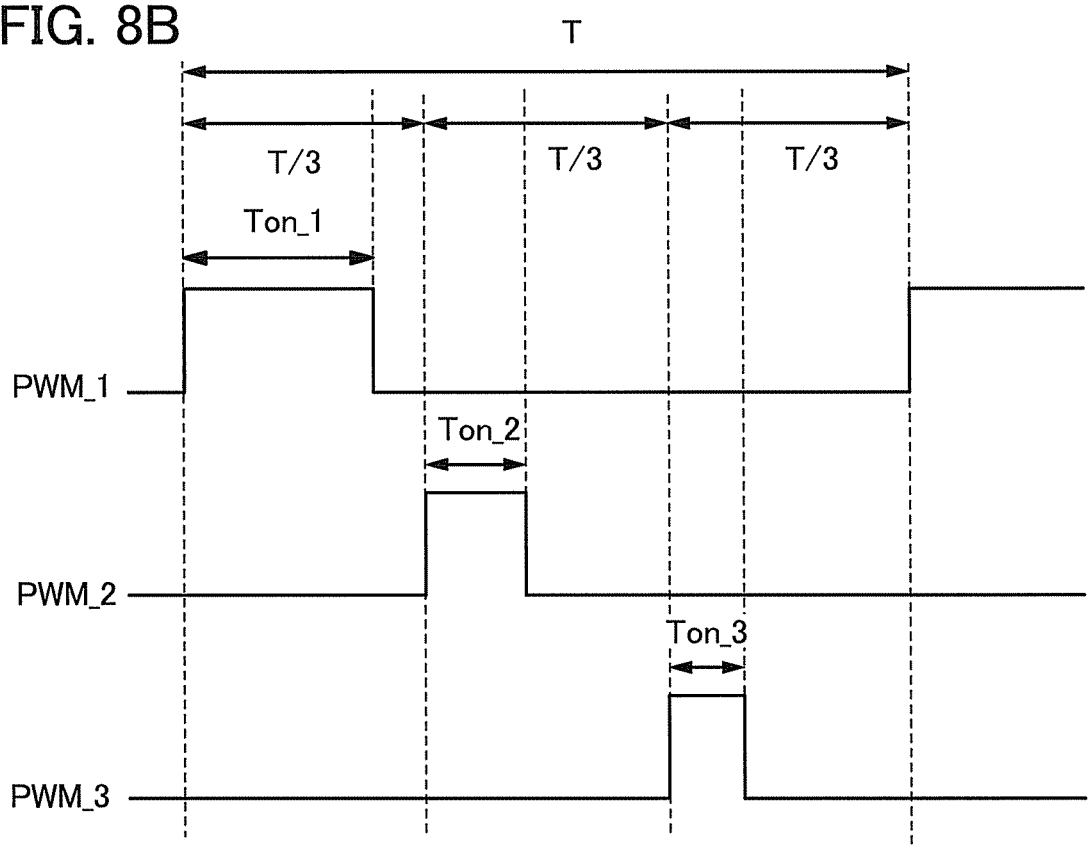

FIGS. 8A and 8B each illustrate an example in which the cycle T is divided into three cycles (each of which is referred to as T/3) and timings of when the levels of the PWM signals PWM_1, PWM_2, and PWM_3 become high are sequentially shifted by T/3. In other words, after T/3 from the level of the PWM signal PWM_1 becomes high, the level of the PWM signal PWM_2 becomes high. Then, after T/3 from the level of the PWM signal PWM_2 becomes high, the level of the PWM signal PWM_3 becomes high.

FIG. 8B is a timing chart at the time when the intensity of sunlight is lower than that in FIG. 8A. When the intensity of sunlight is changed, the maximum power point of a solar cell is changed. Thus, the length of Ton is changed by MPPT.

In FIG. 8B, Ton_1 of the PWM signal PWM_1, Ton_2 of the PWM signal PWM_2, and Ton_3 of the PWM signal PWM_3 are made longer than those in FIG. 8A and are controlled so as not to overlap with each other.

Thus, the fluctuation range of the output voltage Vout which is the sum of the voltage V2_1 output from the first voltage conversion element 103, the voltage V2_2 output from the second voltage conversion element 104, and the voltage V2_3 output from the third voltage conversion element 108 decreases. That is, generation of ripple voltage in the photoelectric conversion device 100 illustrated in FIG. 1 is suppressed. Note that in the case where four or more sets of photoelectric conversion elements and voltage conversion elements are used, the circuits in the photoelectric conversion device 100 may be manufactured on the basis of FIG. 15 and description thereof, and PWM signals and on times Ton may be determined on the basis of FIGS. 8A and 8B and description thereof.

FIGS. 3A and 3B, FIGS. 4A and 4B, FIGS. 5A and 5B, FIGS. 6A and 6B, FIG. 7, and FIGS. 8A and 8B each illustrate the example in which the cycle T of the PWM signal PWM_1 and the cycle T of the PWM signal PWM_2 have the same length in the two step-up circuits which are connected to the first photoelectric conversion element 101 and the second photoelectric conversion element 102. However, in this embodiment, the cycle of the PWM signal PWM_1 and the cycle of the PWM signal PWM_2 do not necessarily have the same length. In the case where the cycle of the PWM signal PWM_1 and the cycle of the PWM signal PWM_2 have different lengths, overlap of Ton (Ton_1 and Ton_2) is easily controlled, which is preferable.

Figure 9A:
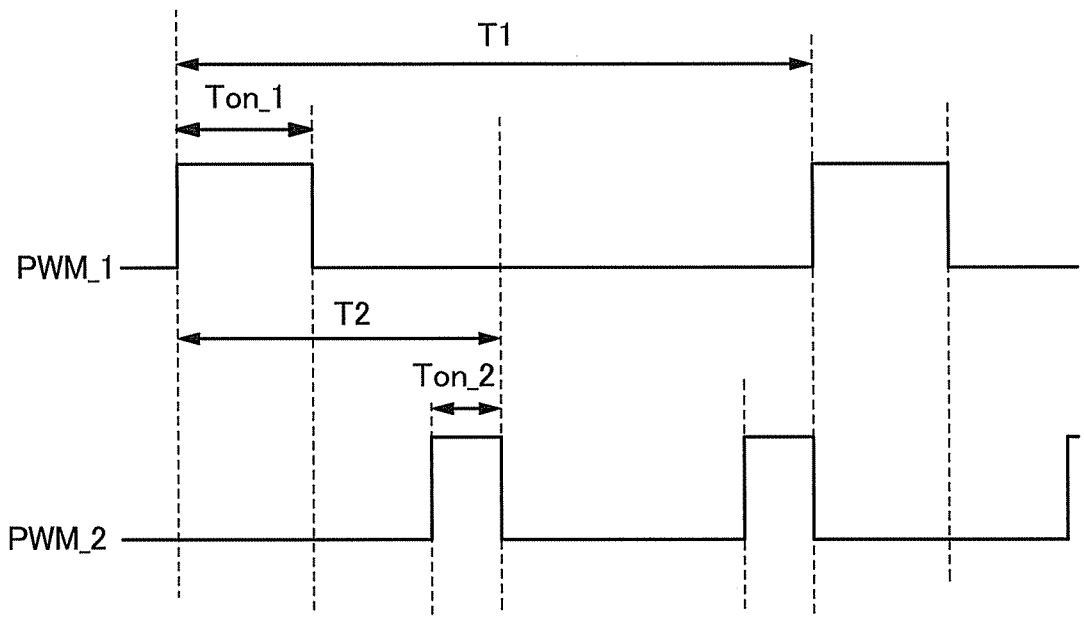
FIGS. 9A and 9B are timing charts of PWM signals.
Figure 9B:
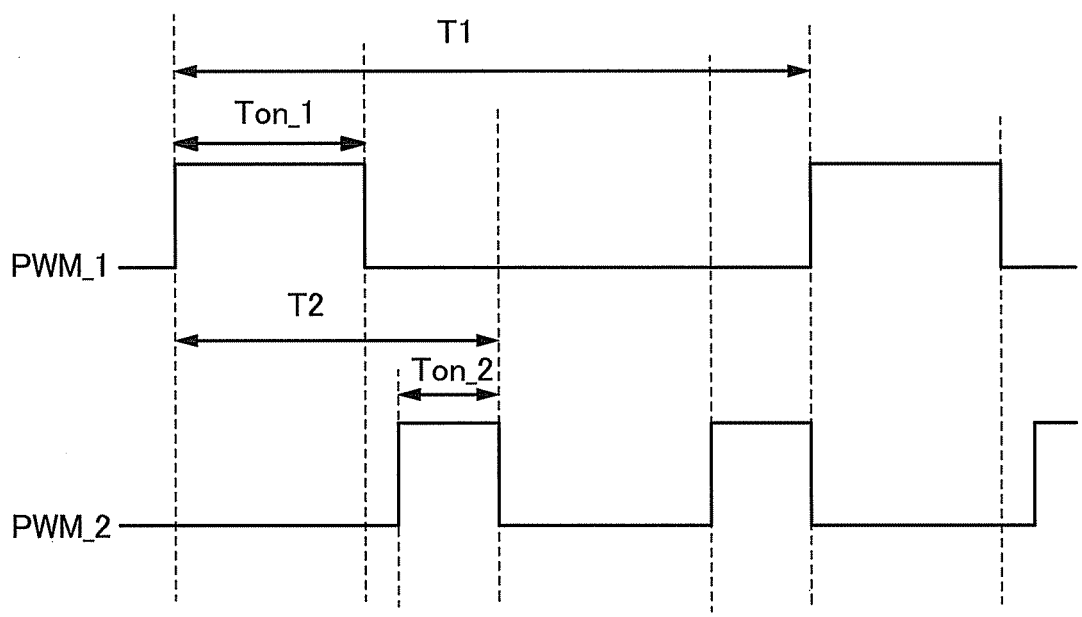

FIGS. 9A and 9B each illustrate an example in which the cycle of the PWM signal PWM_1 and the cycle of the PWM signal PWM_2 are different. A cycle T1 of the PWM signal PWM_1 and a cycle T2 of the PWM signal PWM_2 are different from each other. FIGS. 9A and 9B each illustrate an example in which T2 is half of T1 (T2=T1/2) as an example in which the cycle T1 of the PWM signal PWM_1 and the cycle 72 of the PWM signal PWM_2 are different.

In FIGS. 9A and 9B, the cycle T2 of the PWM signal PWM_2 is half the cycle T1 of the PWM signal PWM_1, and the level of the second PWM signal PWM_2 becomes low at timing of when the level of the second PWM signal PWM_1 becomes high.

FIG. 9B is a timing chart at the time when the intensity of sunlight is lower than that in FIG. 9A. When the intensity of sunlight is changed, the maximum power point of a solar cell is changed. Thus, the length of Ton is changed by MPPT.

In FIG. 9B, Ton_1 of the PWM signal PWM_1 and Ton_2 of the PWM signal PWM_2 are made longer than those in FIG. 9A and are controlled so as not to overlap with each other.

Thus, the fluctuation range of the output voltage Vout which is the sum of the voltage V2_1 output from the first voltage conversion element 103 and the voltage V2_2 output from the second voltage conversion element 104 decreases. That is, generation of ripple voltage in the photoelectric conversion device 100 illustrated in FIG. 1 is suppressed.

Figure 10:
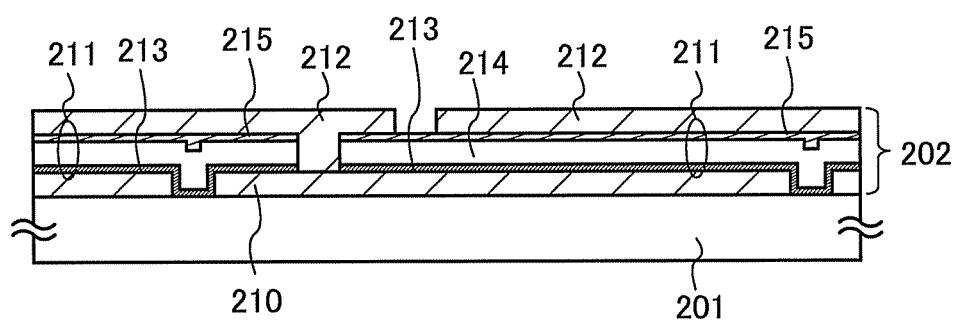
FIG. 10 is a cross-sectional view of a photoelectric conversion element.
Figure 13:
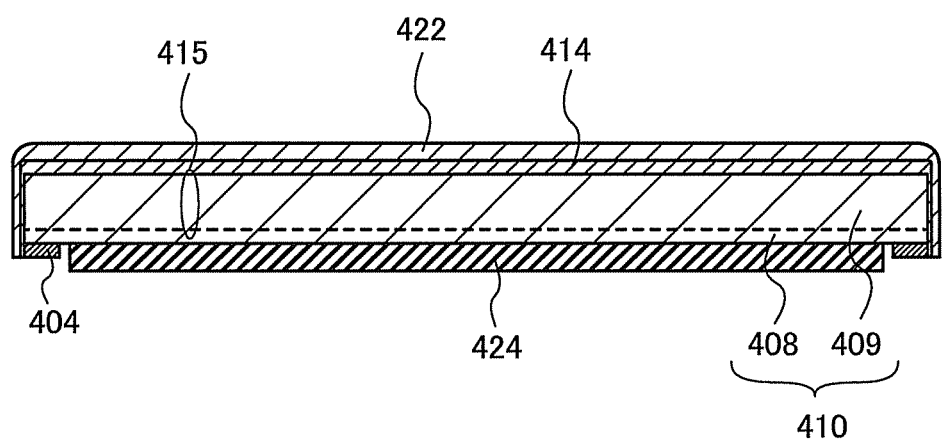
FIG. 13 is a cross-sectional view of a photoelectric conversion element.

In this embodiment, for example, a solar cell which includes an amorphous semiconductor layer as a photoelectric conversion layer 211 in FIG. 10 is used as the photoelectric conversion element 101 illustrated in FIG. 1, and a solar cell which includes a single crystal semiconductor layer as a photoelectric conversion layer 415 in FIG. 13 is used as the photoelectric conversion element 102. In addition, the step-up circuit illustrated in FIG. 2A is used as the first voltage conversion element 103 and the second voltage conversion element 104. Note that these elements are illustrative only, and there is no limitation.

The first photoelectric conversion element 101 in this embodiment is described with reference to FIG. 10. In this embodiment, as an example of the photoelectric conversion element 101, a solar cell which includes an amorphous semiconductor layer as a photoelectric conversion layer is described.

The solar cell illustrated in FIG. 10 includes the photoelectric conversion layer 211 that is an amorphous semiconductor layer over a substrate 201. The photoelectric conversion layer 211 includes a p-type amorphous semiconductor layer 213, an intrinsic amorphous semiconductor layer 214, and an n-type amorphous semiconductor layer 215. A conductive film 210 is provided on one surface of the photoelectric conversion layer 211. A conductive film 212 is provided on the other surface of the photoelectric conversion layer 211.

Specifically, the p-type amorphous semiconductor layer 213, the intrinsic amorphous semiconductor layer 214, and the n-type amorphous semiconductor layer 215 are stacked over the conductive film 210. The conductive film 212 is provided over the n-type amorphous semiconductor layer 215.

The conductive film 210, the photoelectric conversion layer 211, and the conductive film 212 are each processed into a predetermined shape. The conductive film 210, the photoelectric conversion layer 211, and the conductive film 212 which are each processed into a predetermined shape constitute one cell. Each cell is connected in series with a different cell. When each cell is connected in series with a different cell, the level of output voltage can be raised.

On the assumption that light enters from the substrate 201 side, a material that transmits sunlight is used for the substrate 201.

For example, a glass plate of general flat glass, clear flat glass, lead glass, tempered glass, ceramic glass, or the like can be used as the light-transmitting substrate 201. Alternatively, a non-alkali glass substrate of aluminosilicate glass, barium borosilicate glass, aluminoborosilicate glass, or the like; a quartz substrate; or a ceramic substrate can be used.

There is a tendency that a flexible substrate formed using a synthetic resin such as plastics (a plastic substrate) generally has a lower allowable temperature limit than the above substrates when the flexible substrate is used as the light-transmitting substrate 201. However, such a substrate can be used as long as it can withstand processing temperature in manufacturing steps.

Polyester, polyether sulfone (PES), polyethylene naphthalate (PEN), polycarbonate (PC), a polyamide synthetic fiber, polyether etherketone (PEEK), polysulfone (PSF), polyether imide (PEI), polyarylate (PAR), polybutylene terephthalate (PBT), polyimide, an acrylonitrile butadiene styrene resin, poly vinyl chloride, polypropylene, poly vinyl acetate, an acrylic resin, or the like can be used for the plastic substrate. As an example of polyester, polyethylene terephthalate (PET) can be given.

Since light enters from the substrate 201 side, a conductive material that transmits sunlight is used for the conductive film 210.

As a light-transmitting conductive material, for example, it is preferable to use indium tin oxide (ITO), indium tin oxide containing silicon oxide (ITSO), organoindium, organotin, zinc oxide, indium zinc oxide (IZO) containing zinc oxide (ZnO), zinc oxide (ZnO), ZnO doped with gallium (Ga), tin oxide ($SnO_2$), indium oxide containing tungsten oxide, indium zinc oxide containing tungsten oxide, indium oxide containing titanium oxide, indium tin oxide containing titanium oxide, or the like.

Note that in the case where indium tin oxide is used for the conductive film 210, hydrogen contained in the p-type amorphous semiconductor layer 213 reduces indium tin oxide contained in the conductive film 210 when the p-type amorphous semiconductor layer 213 is formed on the conductive film 210. Thus, the film quality of the conductive film 210 might deteriorate.

In the case where indium tin oxide is used for the conductive film 210, in order to prevent indium tin oxide from being reduced, a film in which a conductive film with a thickness of several tens of nanometers using tin oxide or using a conductive material containing a mixed material of zinc oxide and aluminum nitride is stacked between the conductive film using indium tin oxide and the p-type amorphous semiconductor layer 213 is preferably used as the conductive film 210.

In addition, when an uneven surface is formed on the photoelectric conversion layer 211 side of the conductive film 210, light is refracted or is irregularly reflected on the conductive film 210. Thus, optical absorptance in the photoelectric conversion layer 211 increases, so that conversion efficiency can increase, which is preferable.

The photoelectric conversion layer 211 in which the p-type amorphous semiconductor layer 213, the intrinsic amorphous semiconductor layer 214, and the n-type amorphous semiconductor layer 215 are sequentially stacked is provided over the conductive film 210.

In this embodiment, a p-type amorphous silicon layer is used as the p-type amorphous semiconductor layer 213. The p-type amorphous silicon layer is a silicon layer containing an element imparting p-type conductivity (e.g., boron).

In this embodiment, an intrinsic amorphous silicon layer is used as the intrinsic amorphous semiconductor layer 214.

In this embodiment, an n-type amorphous silicon layer is used as the n-type amorphous semiconductor layer 215. The n-type amorphous silicon layer is a silicon layer containing an element imparting n-type conductivity (e.g., phosphorus).

Note that as the photoelectric conversion layer 211, the example in which the p-type amorphous semiconductor layer 213, the intrinsic amorphous semiconductor layer 214, and the n-type amorphous semiconductor layer 215 are stacked in that order is described in this embodiment; however, the n-type amorphous semiconductor layer, the intrinsic amorphous semiconductor layer, and the p-type amorphous semiconductor layer may be stacked in that order.

Note that regardless of whether an amorphous semiconductor layer or a single crystal semiconductor layer is used, it is preferable that the p-type semiconductor layer be located to be closer to a light incidence side than the n-type semiconductor layer. The life of a hole as a carrier is as short as approximately half the life of an electron as a carrier. When light enters the photoelectric conversion layer having a pin junction, a large amount of electrons and holes are formed in the intrinsic semiconductor layer, the electrons move to the n-type semiconductor layer side, and the holes move to the p-type semiconductor layer side, so that electromotive force can be obtained.

When light enters from the p-type semiconductor layer side, many electrons and holes are formed in the intrinsic semiconductor layer in a region closer to the p-type semiconductor layer than the n-type semiconductor layer. Thus, a distance to the p-type semiconductor layer to which the holes having short life move can be shortened. Consequently, high electromotive force can be obtained.

In this embodiment, light enters from both the p-type semiconductor layer side and the n-type semiconductor layer side. Thus, in the photoelectric conversion layer, the n-type semiconductor layer, the intrinsic semiconductor layer, and the p-type semiconductor layer may be stacked in that order, or the p-type semiconductor layer, the intrinsic semiconductor layer, and the n-type semiconductor layer may be stacked in that order. However, when the p-type semiconductor layer is provided on a side with higher intensity of incident light, higher electromotive force can be obtained.

In this embodiment, a photoelectric conversion element in which light enters also from an upper portion of the photoelectric conversion layer 211 is used as an example. Thus, like the conductive film 210, the conductive material that transmits visible light is preferably used for the conductive film 212.

Next, the second photoelectric conversion element 102 is described with reference to FIG. 13. In this embodiment, a solar cell which includes a single crystal semiconductor layer as a photoelectric conversion layer is described as an example of the photoelectric conversion element 102.

FIG. 13 is a cross-sectional view of the solar cell which includes a single crystal semiconductor layer as the photoelectric conversion layer.

Note that in the solar cell illustrated in FIG. 13, light enters from a conductive film 422 side that is in contact with the photoelectric conversion layer 415, and a photoelectric effect is obtained. Here, a main light-receiving surface is on the conductive film 422 side, and a back surface is on a conductive film 424 side.

Specifically, a single crystal semiconductor layer 410 containing an n-type single crystal semiconductor layer 408 is formed on the conductive film 424, and a p-type semiconductor layer 414 is formed over the single crystal semiconductor layer 410.

Note that the stack order of the n-type single crystal semiconductor layer 408 that is an n-type semiconductor layer and the p-type semiconductor layer 414 may be reversed. In that case, a single crystal semiconductor layer containing a p-type single crystal semiconductor layer is formed on the conductive film 424, and an n-type semiconductor layer is formed over the single crystal semiconductor layer.

An insulating layer 404 is formed in a peripheral end portion of a surface of the single crystal semiconductor layer 410 on which the conductive film 424 is formed. On a side surface of the photoelectric conversion device illustrated in FIG. 13, the p-type semiconductor layer 414 covers the single crystal semiconductor layer 410. The insulating layer 404 is provided between the conductive film 424 and a layered structure of the p-type semiconductor layer 414 and the conductive film 422 which are formed on the side surface.

The solar cell illustrated in FIG. 13 includes the single crystal semiconductor layer 410 and the p-type semiconductor layer 414. Further, the n-type single crystal semiconductor layer 408 is formed on one surface side of the single crystal semiconductor layer 410. The n-type single crystal semiconductor layer 408 is formed on a side that is in contact with the conductive film 424 in the single crystal semiconductor layer 410. Note that a region of the single crystal semiconductor layer 410 where the n-type single crystal semiconductor layer 408 is not formed is also referred to as a non-diffusion single crystal semiconductor layer 409 for descriptive purposes. The p-type semiconductor layer 414 is formed on a surface of the single crystal semiconductor layer 410 that is opposite to a surface on which the conductive film 424 is formed.

The single crystal semiconductor layer 410 is a thin single crystal semiconductor substrate and has a thickness of 1 to 10 μm, preferably 3 to 5 μm. A single crystal silicon layer is typically used as the single crystal semiconductor layer 410. For example, a single crystal semiconductor substrate is irradiated with ions by ion implantation or ion doping, and then, part of the single crystal semiconductor substrate is separated by heat treatment, so that the single crystal semiconductor layer 410 can be obtained. Alternatively, a method may be employed by which a single crystal semiconductor substrate is irradiated with a laser beam which makes multi-photon absorption occur and part of the single crystal semiconductor substrate is then separated.

Note that in this specification, ion implantation is a method by which ions produced from a source gas are mass-separated and delivered to an object, so that elements of the ion are added to the object. Ion doping is a method by which ions produced from a source gas are delivered to an object without mass separation, so that elements of the ions are added to the object.

The n-type single crystal semiconductor layer 408 contains an impurity element imparting n-type conductivity. The p-type semiconductor layer 414 contains an impurity element imparting p-type conductivity. Note that a p-type single crystal semiconductor layer and an n-type semiconductor layer can be formed instead of the n-type single crystal semiconductor layer 408 and the p-type semiconductor layer 414, respectively. As the impurity element imparting n-type conductivity, an element which belongs to Group 15 in the periodic table, such as phosphorus or arsenic, is used. As the impurity element imparting p-type conductivity, an element which belongs to Group 13 in the periodic table, such as boron or aluminum, is used.

The n-type single crystal semiconductor layer 408 can be formed by introduction of an impurity element imparting n-type conductivity on the surface of the single crystal semiconductor layer 410 on which the conductive film 424 is formed by ion implantation, ion doping, thermal diffusion, or laser doping. The region of the single crystal semiconductor layer 410 where the n-type single crystal semiconductor layer 408 is not formed is the non-diffusion single crystal semiconductor layer 409. The non-diffusion single crystal semiconductor layer 409 has the same conductivity as the single crystal semiconductor substrate from which the single crystal semiconductor layer 410 is separated. When the single crystal semiconductor substrate from which the single crystal semiconductor layer 410 is separated is an n-type semiconductor substrate, the non-diffusion single crystal semiconductor layer 409 is an n-type semiconductor layer. When the single crystal semiconductor substrate from which the single crystal semiconductor layer 410 is separated is a p-type semiconductor substrate, the non-diffusion single crystal semiconductor layer 409 is a p-type semiconductor layer. As the non-diffusion single crystal semiconductor layer 409, an n-type semiconductor layer or a p-type semiconductor layer is used. The non-diffusion single crystal semiconductor layer 409 may have the same conductivity as the n-type single crystal semiconductor layer 408 or as the p-type semiconductor layer 414. In the case where the non-diffusion single crystal semiconductor layer 409 and the n-type single crystal semiconductor layer 408 have the same conductivity, the non-diffusion single crystal semiconductor layer 409 preferably has a lower impurity concentration than the n-type single crystal semiconductor layer 408. The n-type single crystal semiconductor layer 408 and the non-diffusion single crystal semiconductor layer 409 are made different from each other in the concentration of impurities included therein so that the n-type single crystal semiconductor layer 408 has a higher impurity concentration than the non-diffusion single crystal semiconductor layer 409, whereby carrier collection efficiency can be increased.

As the p-type semiconductor layer 414, a semiconductor layer which contains an impurity element imparting p-type conductivity is formed on the surface of the single crystal semiconductor layer 410 that is opposite to the surface on which the conductive film 424 is formed. Specifically, the p-type semiconductor layer 414 can be formed using a source gas in which a doping gas and a semiconductor material gas are mixed, by chemical vapor deposition, typically plasma-enhanced CVD. The p-type semiconductor layer 414 is formed using a microcrystalline semiconductor layer, an amorphous semiconductor layer, or a single crystal semiconductor layer. A microcrystalline silicon layer is typically used as the p-type semiconductor layer 414.

The conductive film 424 is formed in contact with the n-type single crystal semiconductor layer 408 in the photoelectric conversion layer 415. The conductive film 424 is provided on a back surface side of the solar cell of this embodiment and can also be referred to as a back surface electrode. The conductive film 422 is formed in contact with the p-type semiconductor layer 414 in the photoelectric conversion layer 415. The conductive film 422 is provided on a main light-receiving surface side of the solar cell of this embodiment and can also be referred to as a light-receiving surface electrode. In the solar cell of this embodiment, one of the conductive film 424 and the conductive film 422 corresponds to a positive electrode and the other corresponds to a negative electrode. The solar cell of this embodiment has a structure in which the electrode corresponding to a positive electrode and the electrode corresponding to a negative electrode are located on the photoelectric conversion layer 415 which performs photoelectric conversion so as to be opposite to each other.

Further, in the solar cell of this embodiment, preferably, a p-type semiconductor layer is provided on the light incidence side and an n-type semiconductor layer is provided on the back surface side. In other words, preferably, the p-type semiconductor layer 414 is formed in contact with the conductive film 422 that corresponds to the light incidence side and the n-type single crystal semiconductor layer 408 is formed in contact with the conductive film 424 that corresponds to the back surface side.

As described above, the life of a hole as a carrier is as short as approximately half the life of an electron as a carrier. Thus, the movement distance of holes is preferably shortened in consideration of hole carrier lifetime.

The single crystal semiconductor layer 410 that is in contact with the conductive film 424 corresponding to the back surface side is made to be a p-type single crystal semiconductor layer, and a p-type single crystal semiconductor layer of a $p^+$-type semiconductor with a higher concentration than the single crystal semiconductor layer 410 is formed by introduction of an impurity element imparting p-type conductivity into the single crystal semiconductor layer 410. Thus, a back surface field (BSF) can be formed. A light confinement effect due to BSF can prevent recombination of carriers (electrons and holes) generated by photoexcitation, and carrier collection efficiency can be increased. Note that in that case, an n-type semiconductor layer is formed in contact with the conductive film 422 corresponding to the light incidence side.

Note that in this embodiment, the solar cell which includes an amorphous semiconductor layer as the photoelectric conversion layer 211 is used as the photoelectric conversion element 101 and the solar cell which includes a single crystal semiconductor layer as the photoelectric conversion layer 415 is used as the photoelectric conversion element 102; however, this embodiment is not limited to this. Any photoelectric conversion elements can be used as the photoelectric conversion element 101 and the photoelectric conversion element 102 as long as they have different characteristics.

In this embodiment, the photoelectric conversion element 101 and the photoelectric conversion element 102 are formed in different manufacturing steps; however, the photoelectric conversion element 101 and the photoelectric conversion element 102 are preferably stacked because the area of the first photoelectric conversion element 101 and the second photoelectric conversion element 102 can be reduced.

An example in which the photoelectric conversion element 101 and the photoelectric conversion element 102 with different characteristics are stacked is described below with reference to FIG. 11.

Figure 11:
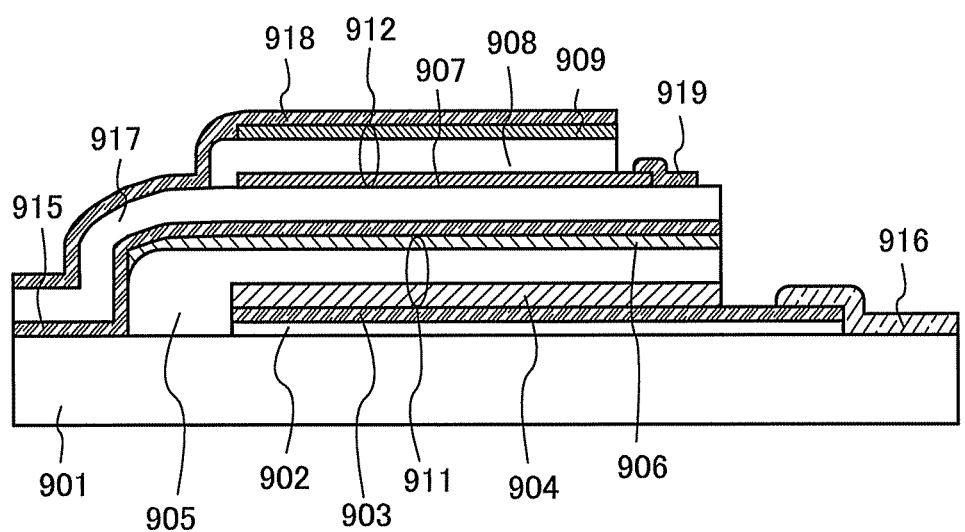
FIG. 11 is a cross-sectional view of a photoelectric conversion element.

FIG. 11 is a cross-sectional view of a solar cell in which a single crystal semiconductor layer is provided in a first photoelectric conversion layer, an amorphous semiconductor layer is provided in a second photoelectric conversion layer, and the first and second photoelectric conversion layers are stacked.

The solar cell illustrated in FIG. 11 has a structure in which over a support substrate 901, an insulating layer 902, a conductive film 903, a first photoelectric conversion layer 911, a conductive film 915, an insulating layer 917, a second photoelectric conversion layer 912, and a conductive film 918 are stacked in that order.

The first photoelectric conversion layer 911 has a layered structure of a p-type single crystal semiconductor layer 904, an intrinsic microcrystalline semiconductor layer 905, and an n-type microcrystalline semiconductor layer 906.

The support substrate 901 is a substrate having an insulating surface or an insulating substrate. As the insulating substrate, for example, a variety of glass substrates used in the electronics industry, such as an aluminosilicate glass substrate, an aluminoborosilicate glass substrate, and a barium borosilicate glass substrate, can be used. An insulating substrate formed using an insulator, such as a ceramic substrate, a quartz substrate, or a sapphire substrate; a substrate formed using a conductor such as a metal or stainless steel and whose surface is subjected to insulation treatment; or the like may be used instead of the glass substrate.

The insulating layer 902 has a function of bonding the support substrate 901 and the conductive film 903 to each other. From this point of view, the insulating layer 902 can be called a bond layer. In addition, the conductive film 903 is formed in contact with the first photoelectric conversion layer 911; thus, the first photoelectric conversion layer 911 is fixed to the support substrate 901 by the insulating layer 902.

The conductive film 903 is preferably formed using a light-transmitting material in order to transmit sunlight.

An auxiliary electrode 916 is formed in a region of the conductive film 903 where the first photoelectric conversion layer 911 is not formed, so that electric energy can be extracted outside.

In the first photoelectric conversion layer 911, the p-type single crystal semiconductor layer 904 and the n-type microcrystalline semiconductor layer 906 are a single crystal semiconductor layer that contains an impurity element imparting p-type conductivity and a microcrystalline semiconductor layer that contains an impurity element imparting n-type conductivity, respectively. An element that belongs to Group 13 in the periodic table, such as boron or aluminum, can be used as the impurity element imparting p-type conductivity, and an element that belongs to Group 15 in the periodic table, such as phosphorus or arsenic, can be used as the impurity element imparting n-type conductivity.

Note that as the first photoelectric conversion layer 911, the p-type single crystal semiconductor layer 904, the intrinsic microcrystalline semiconductor layer 905, and the n-type microcrystalline semiconductor layer 906 are stacked in that order; however, the stack order of the p-type semiconductor layer and the n-type semiconductor layer may be reversed. In that case, an n-type single crystal semiconductor layer and a p-type microcrystalline semiconductor layer may be formed instead of the p-type single crystal semiconductor layer 904 and the n-type microcrystalline semiconductor layer 906, respectively. Note that in the case where the n-type single crystal semiconductor layer, the intrinsic microcrystalline semiconductor layer, and the p-type microcrystalline semiconductor layer are stacked as the first photoelectric conversion layer 911, it is necessary that the n-type semiconductor layer, the intrinsic semiconductor layer, and the p-type semiconductor layer be stacked in that order as the second photoelectric conversion layer 912.

A single crystal silicon layer is typically used as the p-type single crystal semiconductor layer 904.

The p-type single crystal semiconductor layer 904 can be formed by being separated from a single crystal semiconductor substrate. For example, ions of hydrogen or the like are introduced into the single crystal semiconductor substrate at a high concentration so that the p-type single crystal semiconductor layer 904 is separated from the single crystal semiconductor substrate along a region into which the ions are introduced. As the single crystal semiconductor substrate, a single crystal silicon wafer may be used.

The intrinsic microcrystalline semiconductor layer 905 and the n-type microcrystalline semiconductor layer 906 are formed in such a manner that a microcrystalline semiconductor layer is formed over the p-type single crystal semiconductor layer 904 and an impurity element imparting n-type conductivity is added to part of the microcrystalline semiconductor layer. A region in the microcrystalline semiconductor layer to which the impurity element imparting n-type conductivity is added serves as the n-type microcrystalline semiconductor layer 906, and a region in the microcrystalline semiconductor layer to which the impurity element imparting n-type conductivity is not added serves as the intrinsic microcrystalline semiconductor layer 905.

The insulating layer 917 is provided so as to cover the n-type microcrystalline semiconductor layer 906. The insulating layer 917 has a function of insulating the first photoelectric conversion layer 911 and the second photoelectric conversion layer 912 from each other.

The second photoelectric conversion layer 912 and the conductive film 918 are stacked over the insulating layer 917. The second photoelectric conversion layer 912 includes a p-type amorphous semiconductor layer 907, an intrinsic amorphous semiconductor layer 908, and an n-type amorphous semiconductor layer 909.

An auxiliary electrode 919 is formed over a region of the insulating layer 917 where the second photoelectric conversion layer 912 is not formed, so that electric energy can be extracted outside.

As the p-type amorphous semiconductor layer 907, the intrinsic amorphous semiconductor layer 908, and the n-type amorphous semiconductor layer 909, for example, a p-type amorphous silicon layer, an intrinsic amorphous silicon layer, and an n-type amorphous silicon layer can be used, respectively. The p-type amorphous silicon layer, the intrinsic amorphous silicon layer, and the n-type amorphous silicon layer may be formed by plasma-enhanced CVD, for example. When the p-type amorphous silicon layer is formed by plasma-enhanced CVD, a silane-based gas and diborane may be used as raw materials. When the intrinsic amorphous silicon layer is formed by plasma-enhanced CVD, a silane-based gas may be used as a raw material. When the n-type amorphous silicon layer is formed by plasma-enhanced CVD, a silane-based gas and phosphine may be used as raw materials.

The conductive film 918 is formed in contact with the n-type amorphous semiconductor layer 909.

The conductive film 918 is preferably formed using a light-transmitting material because sunlight can be transmitted through the conductive film 918.

When the first photoelectric conversion layer 911 and the second photoelectric conversion layer 912 that are illustrated in FIG. 11 are used as the first photoelectric conversion element 101 and the second photoelectric conversion element 102, respectively, the area of the first photoelectric conversion element 101 and the second photoelectric conversion element 102 can be reduced, which is preferable.

As a semiconductor material used for the photoelectric conversion layer, germanium; or a compound semiconductor such as silicon carbide, gallium arsenide, indium phosphide, zinc selenide, gallium nitride, or silicon germanium can be used instead of silicon, for example.

As the photoelectric conversion layer, not only an amorphous semiconductor layer or a single crystal semiconductor layer but also a polycrystalline semiconductor layer or a microcrystalline semiconductor layer may be used. The photoelectric conversion layer using a polycrystalline semiconductor can be formed by crystallization of an amorphous semiconductor film or a microcrystalline semiconductor film by laser crystallization, thermal crystallization, thermal crystallization in which a catalytic element which promotes crystallization, such as nickel, is used, or the like alone, or by any of the methods in combination. Alternatively, a polycrystalline semiconductor layer may be formed directly by sputtering, plasma-enhanced CVD, thermal CVD, or the like.

Alternatively, in this embodiment, a polycrystalline semiconductor layer can be used instead of a single crystal semiconductor layer. Typically, a polycrystalline silicon layer can be used. In the case where a polycrystalline semiconductor layer is used instead of a single crystal semiconductor layer, the term "single crystal semiconductor" in this embodiment can be replaced with the term "polycrystalline semiconductor".

As each of the first photoelectric conversion element 101 and the second photoelectric conversion element 102, a hetero-junction with intrinsic thin-layer (HIT) solar cell, a CIG-based thin film solar cell, a CdTe solar cell, an organic thin film solar cell, a dye sensitization solar cell, or the like can be used. In this embodiment, any solar cells can be used regardless of kind as long as they have different characteristics.

Thus, the first photoelectric conversion element and the second photoelectric conversion element whose characteristic is different from that of the first photoelectric conversion element can be obtained.

In addition, the first photoelectric conversion element and the second photoelectric conversion element whose characteristic is different from that of the first photoelectric conversion element have different maximum power points. The first and second voltage conversion elements are connected to the first and second photoelectric conversion elements whose maximum power points are different, respectively. The first and second voltage conversion elements can perform MPPT in accordance with the characteristics of the photoelectric conversion elements to which they are connected, so that output efficiency increases.

Thus, a photoelectric conversion device in which the output of the first photoelectric conversion element and the output of the second photoelectric conversion element whose characteristic is different from the characteristic of the first photoelectric conversion element are added has high output efficiency, which is preferable.

As an example of the transistor 302 of the voltage conversion element 301 in FIG. 2A or the transistor 312 of the voltage conversion element 311 in FIG. 2B, a transistor 710 to be described later is given. The structure and formation method of the transistor 710 are described with reference to FIGS. 17A and 17B, FIGS. 18A to 18E, and FIGS. 19A to 19C.

Figure 17A:
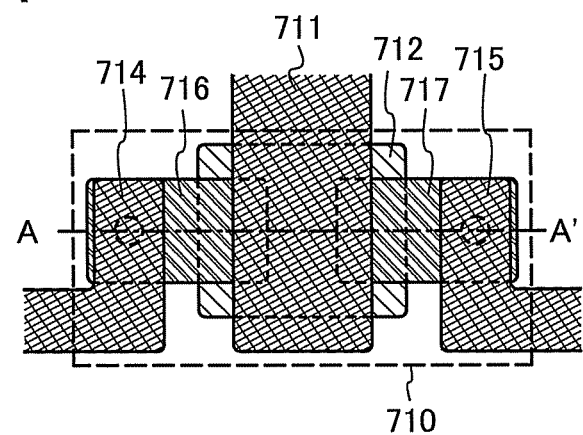
FIGS. 17A and 17B are a top view and a cross-sectional view of a transistor.
Figure 17B:
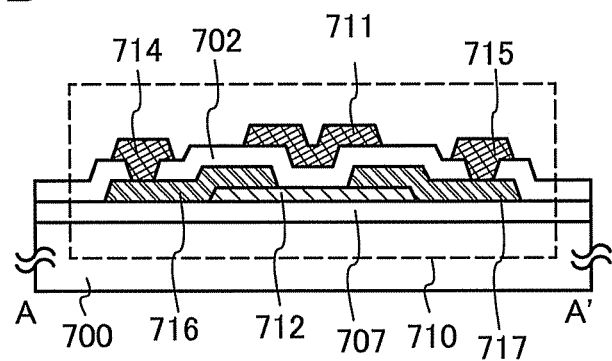

FIG. 17A is a plan view of the transistor 710, and FIG. 17B illustrates an example of the cross-sectional structure of the transistor 710. FIG. 17A is a plan view of the top-gate transistor 710, and FIG. 17B is a cross-sectional view taken along line A-A' in FIG. 17A.

The transistor 710 includes, over a substrate 700, an insulating film 707, an oxide semiconductor film 712, an electrode 716 that is one of a source electrode and a drain electrode, an electrode 717 that is the other of the source electrode and the drain electrode, a gate insulating film 702, and a gate electrode 711. A wiring layer 714 and a wiring layer 715 are formed in contact with and electrically connected to the electrode 716 and the electrode 717, respectively. The transistor 710 can be referred to as a top-contact transistor because the electrode 716 and the electrode 717 that are the source electrode and the drain electrode are in contact with an upper surface of the oxide semiconductor film 712 that includes a channel formation region.

The oxide semiconductor film 712 functions as the channel formation region. Further, the oxide semiconductor film 712 has a light-transmitting property.

Note that although the transistor 710 in FIG. 17A has a single-gate structure, this embodiment is not limited to this structure. The transistor 710 may have a multi-gate structure which includes a plurality of gate electrodes and a plurality of channel formation regions.

The oxide semiconductor film functioning as the channel formation region of the transistor 710 is preferably a high-purity oxide semiconductor film. The features and advantages of a transistor including a high-purity oxide semiconductor film are described below.

In the high-purity oxide semiconductor film, impurities that adversely affect the electrical characteristics of a transistor including an oxide semiconductor are reduced to a very low level. As a typical example of an impurity which adversely affects the electrical characteristics, there is hydrogen.

Hydrogen is an impurity which might be a carrier donor in an oxide semiconductor film. When the oxide semiconductor film includes a large amount of hydrogen, the oxide semiconductor might have n-type conductivity.

A transistor including an oxide semiconductor film which includes a large amount of hydrogen is normally on. In addition, the on/off ratio of the transistor cannot be high enough.

Therefore, in this specification, a high-purity oxide semiconductor film is an intrinsic or substantially intrinsic oxide semiconductor film from which hydrogen is reduced as much as possible. As an example of a high-purity oxide semiconductor film, there is an oxide semiconductor film whose carrier concentration is lower than $1 \times 10^{14}/cm^3$, preferably lower than $1 \times 10^{12}/cm^3$, more preferably lower than $1 \times 10^{11}/cm^3$ or lower than $6.0 \times 10^{10}/cm^3$.

A transistor including a high-purity oxide semiconductor film which is obtained by drastic removal of hydrogen contained in an oxide semiconductor film for a channel formation region has much lower off-state current than a transistor including silicon for a channel formation region, for example.

In this embodiment, a transistor including a high-purity oxide semiconductor film is described below as an n-channel transistor.

Note that in this specification, off-state current (also referred to as leakage current) is current flowing between a source and a drain of an n-channel transistor when given gate voltage which is in the range of from −20 to −5 V is applied at room temperature in the case where the level of the threshold voltage $V_{th}$ of the n-channel transistor is positive. Note that the room temperature is 15 to 25° C. A transistor including an oxide semiconductor film that is disclosed in this specification has a current per channel width (W) of 100 zA/μm or less, preferably 10 zA/μm or less at room temperature.

Note that if the amount of the off-state current and the level of the drain voltage are known, resistance when the transistor is off (off resistance R) can be calculated using Ohm's law. If a cross section A of the channel formation region and the channel length L are known, off-state resistivity ρ can be calculated from the formula $\rho = RA/L$ (R indicates off resistance). The off-state resistivity is preferably $1 \times 10^9$ Ω·m or higher (or $1 \times 10^{10}$ Ω·m or higher). Here, the cross section A can be calculated from the formula A=dW (d is the thickness of the channel formation region and W is the channel width).

Further, the energy gap of the oxide semiconductor film is 2 eV or more, preferably 2.5 eV or more, more preferably 3 eV or more.

In addition, the temperature characteristics of the transistor including a high-purity oxide semiconductor film are favorable. Typically, in the case where the current-voltage characteristics of the transistor when the temperature is changed in the range of from −25 to 150° C. are measured, on-state current, off-state current, field-effect mobility, a subthreshold value (an S value), and threshold voltage hardly change and deteriorate due to temperature.

Next, hot-carrier degradation of a transistor including an oxide semiconductor film is described.

The hot-carrier degradation is degradation of transistor characteristics, e.g., the fluctuation in threshold voltage or generation of gate leakage due to a phenomenon that electrons which are accelerated to high speed become fixed charges by being injected into a gate insulating film from a channel formation region in the vicinity of a drain, or a phenomenon that electrons which are accelerated to high speed form a trap level at an interface of a gate insulating film. The factors of the hot-carrier degradation are channel-hot-electron injection (CHE injection) and drain-avalanche-hot-carrier injection (DAHC injection).

Since the band gap of silicon is as small as 1.12 eV, electrons are easily generated like an avalanche due to an avalanche breakdown, and the number of electrons which are accelerated to high speed so as to go over a barrier to the gate insulating film is increased. In contrast, the oxide semiconductor film described in this embodiment has a large band gap of 3.15 eV; thus, the avalanche breakdown does not easily occur and resistance to hot-carrier degradation is higher than that of silicon.

Note that although the band gap of silicon carbide, which is one of materials having high withstand voltage, and the band gap of an oxide semiconductor are substantially equal to each other, electrons are less likely to be accelerated in the oxide semiconductor because the mobility of the oxide semiconductor is lower than that of silicon carbide. Further, a barrier between the oxide semiconductor and an oxide film that is a gate insulating film is higher than a barrier between silicon carbide, gallium nitride, or silicon and the oxide film; thus, the number of electrons injected into the oxide film is extremely small. The oxide semiconductor therefore has less hot-carrier degradation as compared to silicon carbide, gallium nitride, or silicon, and it can be said that drain withstand voltage is high. It is therefore not necessary to intentionally form low-concentration impurity regions between an oxide semiconductor functioning as a channel formation region and a source and drain electrodes, so that the structure of the transistor can be significantly simplified and the number of manufacturing steps can be reduced.

As described above, a transistor including an oxide semiconductor has high drain withstand voltage. Specifically, such a transistor can have a drain withstand voltage of 100 V or higher, preferably 500 V or higher, more preferably 1 kV or higher.

The oxide semiconductor is a semiconductor with high transmittance of visible light. Thus, even when a transistor which includes such a light-transmitting oxide semiconductor in a channel formation region overlaps with a photoelectric conversion element, the transistor does not block visible light from reaching the photoelectric conversion element.

Next, steps of forming the transistor 710 are described with reference to FIGS. 18A to 18E.

First, the substrate 700 is prepared. On the assumption that light enters the transistor 710 from the substrate 700 side, a material that transmits sunlight is used for the substrate 700.

For example, a glass plate of general flat glass, clear flat glass, lead glass, tempered glass, ceramic glass, or the like can be used as the light-transmitting substrate 700. Alternatively, a non-alkali glass substrate of aluminosilicate glass, barium borosilicate glass, aluminoborosilicate glass, or the like; a quartz substrate; or a ceramic substrate can be used.

There is a tendency that a flexible substrate formed using a synthetic resin such as plastics (a plastic substrate) generally has a lower allowable temperature limit than the above substrates when the flexible substrate is used as the light-transmitting substrate 700. However, such a substrate can be used as long as it can withstand processing temperature in manufacturing steps.

Polyester, polyether sulfone (PES), polyethylene naphthalate (PEN), polycarbonate (PC), a polyamide synthetic fiber, polyether etherketone (PEEK), polysulfone (PSF), polyether imide (PEI), polyarylate (PAR), polybutylene terephthalate (PBT), polyimide, an acrylonitrile butadiene styrene resin, poly vinyl chloride, polypropylene, poly vinyl acetate, an acrylic resin, or the like can be used for the plastic substrate. As an example of polyester, polyethylene terephthalate (PET) can be given.

The insulating film 707 serving as a base film is formed over the substrate 700.

As the insulating film 707, an oxide insulating film such as a silicon oxide film, a silicon oxynitride film, an aluminum oxide film, and an aluminum oxynitride film is preferably used. As a method for forming the insulating film 707, plasma-enhanced CVD, sputtering, or the like can be used. In order that a large amount of hydrogen be not contained in the insulating film 707, the insulating film 707 is preferably formed by sputtering.

In this embodiment, a silicon oxide film is formed as the insulating film 707 by sputtering. Specifically, the silicon oxide film is formed over the substrate 700 as the insulating film 707 in such a manner that the substrate 700 is transferred to a treatment chamber, a sputtering gas containing high-purity oxygen from which hydrogen and moisture are removed is introduced, and a target of silicon or silicon oxide is used. Note that the substrate 700 may be at room temperature or may be heated during deposition.

A specific example of the condition for deposition of a silicon oxide film is as follows: quartz (preferably synthetic quartz) is used as the target; the substrate temperature is 108° C.; the distance between the substrate 700 and the target (T-S distance) is 60 mm; the pressure is 0.4 Pa; the high-frequency power is 1.5 kW; the atmosphere contains oxygen and argon (an oxygen flow rate of 25 sccm:an argon flow rate of 25 sccm=1:1); and RF sputtering is used. The thickness of the silicon oxide film is 100 nm. Note that a silicon target can be used as the target instead of quartz (preferably synthetic quartz). Further, an oxygen gas may be used as a sputtering gas instead of a mixed gas of oxygen and argon. Here, as a sputtering gas used for deposition of the insulating film 707, a high-purity gas from which an impurity such as hydrogen, water, a hydroxyl group, or hydride is reduced to about a concentration of ppm or ppb is preferably used.

Further, at the time of the deposition of the insulating film 707, it is preferable that the insulating film 707 be deposited while moisture remaining in the treatment chamber is removed in order that hydrogen, water, a hydroxyl group, or hydride be not contained in the insulating film 707.

In order to remove moisture remaining in the treatment chamber, an adsorption vacuum pump may be used. For example, a cryopump, an ion pump, or a titanium sublimation pump can be used. Further, as an exhaustion means, a turbo pump is preferably used in combination with a cold trap. A treatment chamber which is exhausted with a cryopump is preferable because a hydrogen atom, a compound including a hydrogen atom, such as water ($H_2O$), or the like is exhausted and hydrogen atoms are hardly included in the insulating film 707 deposited in the treatment chamber.

Examples of sputtering include RF sputtering in which a high-frequency power source is used as a sputtering power source, DC sputtering, and pulsed DC sputtering in which a bias is applied in a pulsed manner. RF sputtering is mainly used in the case where an insulating film is deposited, and DC sputtering is mainly used in the case where a metal film is deposited.

In addition, there is also a multi-source sputtering apparatus in which a plurality of targets of different materials can be set. With the multi-source sputtering apparatus, films of different materials can be deposited to be stacked in one chamber, or a film can be deposited by electric discharge of plural kinds of materials at the same time in one chamber.

In addition, there are a sputtering apparatus provided with a magnet system inside the chamber and used for magnetron sputtering, and a sputtering apparatus used for ECR sputtering in which plasma generated with the use of microwaves is used without using glow discharge.

Further, as a deposition method using sputtering, reactive sputtering in which a target substance and a sputtering gas component are chemically reacted with each other during deposition to form a thin compound film thereof, or bias sputtering in which voltage is also applied to a substrate during deposition can be used.

Furthermore, the structure of the insulating film 707 is not limited to a single-layer structure, and may be a layered structure. For example, the insulating film 707 may have a layered structure in which a nitride insulating film such as a silicon nitride film, a silicon nitride oxide film, an aluminum nitride film, or an aluminum nitride oxide film and the oxide insulating film are stacked in that order from the substrate 700 side.

For example, a sputtering gas containing high-purity nitrogen is introduced and a silicon nitride film is deposited over the substrate with the use of a silicon target. Then, the sputtering gas is changed to a high-purity oxygen gas, and a silicon oxide film is deposited. In that case also, it is preferable to deposit a silicon nitride film or a silicon oxide film while moisture remaining in the treatment chamber is removed as in the above case. Further, the substrate may be heated during the deposition.

Next, an oxide semiconductor film is formed over the insulating film 707 by sputtering.

In order that hydrogen, a hydroxyl group, and moisture be contained in the oxide semiconductor film as little as possible, it is preferable that an impurity such as hydrogen or moisture that is adsorbed on the substrate 700 be eliminated and exhausted by preheating of the substrate 700 over which the insulating film 707 is formed in a preheating chamber of a sputtering apparatus, as pretreatment for deposition. As an exhaustion means provided in the preheating chamber, a cryopump is preferable in order to exhaust a hydrogen atom, a compound containing a hydrogen atom, such as water ($H_2O$), or the like. Further, this preheating is preferably performed on the substrate 700 before the deposition of the gate insulating film 702. Further, this preheating is preferably performed similarly on the substrate 700 over which the electrode 716 and the electrode 717 are formed. Note that these preheating treatments may be omitted.

Note that before the oxide semiconductor film is deposited by sputtering, dust on a surface of the insulating film 707 is preferably removed by reverse sputtering in which an argon gas is introduced and plasma is generated. The reverse sputtering is a method in which a high-frequency power source is used for application of voltage to a substrate in an argon atmosphere and plasma is generated in the vicinity of the substrate so that a substrate surface is modified. Note that nitrogen, helium, oxygen, or the like may be used instead of the argon atmosphere.

As a target used for the deposition of the oxide semiconductor film, a target of a metal oxide containing zinc oxide as a main component can be used. For example, a target having a composition ratio of $In_2O_3:Ga_2O_3:ZnO=1:1:1$ (molar ratio), a target having a composition ratio of $In_2O_3:Ga_2O_3:ZnO=1:1:2$ (molar ratio), or a target having a composition ratio of $In_2O_3:Ga_2O_3:ZnO=1:1:4$ (molar ratio) can be used as the target. The filling rate of a target including In, Ga, and Zn is higher than or equal to 90% and lower than or equal to 100%, preferably higher than or equal to 95% and lower than 100%. With the use of the target with a high filling rate, a dense oxide semiconductor film is deposited.

Note that the oxide semiconductor film may be deposited in a rare gas (typically argon) atmosphere, an oxygen atmosphere, or a mixed atmosphere of a rare gas and oxygen. Here, as a sputtering gas used for deposition of the oxide semiconductor film, a high-purity gas from which an impurity such as hydrogen, water, a hydroxyl group, or hydride is reduced to about a concentration of ppm or ppb is preferably used.

The oxide semiconductor film is deposited over the substrate 700 in such a manner that the substrate is held in a treatment chamber kept in a reduced pressure state, moisture remaining in the treatment chamber is removed, a sputtering gas from which hydrogen and moisture are removed is introduced, and a metal oxide is used as a target. In order to remove moisture remaining in the treatment chamber, an adsorption vacuum pump is preferably used. For example, a cryopump, an ion pump, or a titanium sublimation pump is preferably used. As an exhaust means, a turbo pump to which a cold trap is added may be used. For example, a hydrogen atom, a compound containing a hydrogen atom, such as water ($H_2O$), (preferably, also a compound containing a carbon atom), and the like are exhausted from the treatment chamber with the use of a cryopump. Thus, the concentration of an impurity contained in the oxide semiconductor film which is deposited in the treatment chamber can be lowered. Further, the substrate may be kept at room temperature or may be heated at a temperature lower than 400° C. when the oxide semiconductor film is deposited.

As an example of the deposition condition of the oxide semiconductor film, the following condition is employed: the substrate temperature is room temperature, the distance between the substrate and the target is 110 mm, the pressure is 0.4 Pa, the direct current (DC) power is 0.5 kW, and an atmosphere containing oxygen and argon (an oxygen flow rate of 15 sccm:an argon flow rate of 30 sccm=1:2) is used. Note that it is preferable that pulsed direct-current (DC) power be used because dust can be reduced and the film thickness can be uniform. The thickness of the oxide semiconductor film is 2 to 200 nm, preferably 5 to 30 nm. Note that the appropriate thickness of the oxide semiconductor film differs depending on an oxide semiconductor material, and the thickness may be set as appropriate depending on the material.

Although an In—Ga—Zn—O-based oxide that is an oxide of three metal elements is used as the oxide semiconductor in the given example, the following oxide semiconductors can be used: an In—Sn—Ga—Zn—O-based oxide that is an oxide of four metal elements; an In—Sn—Zn—O-based oxide, an In—Al—Zn—O-based oxide, a Sn—Ga—Zn—O-based oxide, an Al—Ga—Zn—O-based oxide, or a Sn—Al—Zn—O-based oxide that is an oxide of three metal elements; an In—Zn—O-based oxide, an In—Ga—O-based oxide, a Sn—Zn—O-based oxide, an Al—Zn—O-based oxide, a Zn—Mg—O-based oxide, a Sn—Mg—O-based oxide, or an In—Mg—O-based oxide that is an oxide of two metal elements; an In—O-based oxide; a Sn—O-based oxide; a Zn—O-based oxide; and the like. The oxide semiconductor may further contain silicon. Further, the oxide semiconductor may be amorphous or crystalline. Alternatively, the oxide semiconductor may be non-single-crystal or single crystal. Note that in this specification, an oxide of three metal elements is a metal oxide including three metal elements in addition to oxygen (O). Similarly, an oxide of four metal elements is a metal oxide including four metal elements in addition to oxygen (O), and an oxide of two metal elements is a metal oxide including two metal elements in addition to oxygen (O).

As the oxide semiconductor film, a thin film expressed by $InMO_3(ZnO)_m$ (m>0) can also be used. Here, M denotes one or more metal elements selected from Ga, Al, Mn, and Co. For example, M can be Ga, Ga and Al, Ga and Mn, or Ga and Co.

Figure 18A:
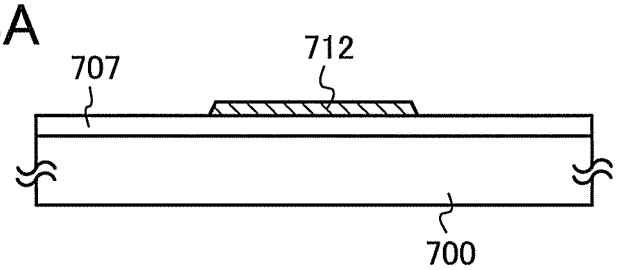
FIGS. 18A to 18E are cross-sectional views illustrating a method for forming the transistor.
Figure 18B:
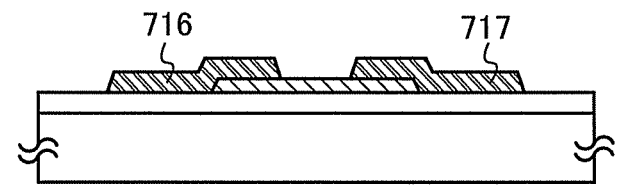

Then, the oxide semiconductor film is processed into the island-shaped oxide semiconductor film 712 through a first photolithography process (see FIG. 18A). Note that a resist used for forming the island-shaped oxide semiconductor film 712 may be formed by an inkjet method. When the resist is formed by an inkjet method, a photomask is not used; thus, manufacturing cost can be reduced.

Note that as the etching of the oxide semiconductor film, dry etching, wet etching, or both dry etching and wet etching may be employed.

In the case of dry etching, parallel plate RIE (reactive ion etching) or ICP (inductively coupled plasma) etching can be employed. In order to etch the film to have a desired shape, the etching conditions (the amount of electric power applied to a coiled electrode, the amount of electric power applied to an electrode on a substrate side, the temperature of the electrode on the substrate side, and the like) are adjusted as appropriate.

As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferable; however, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As an etchant used for wet etching, a mixed solution of phosphoric acid, acetic acid, and nitric acid, an ammonia hydrogen peroxide mixture (a hydrogen peroxide solution at 31 wt %:ammonia water at 28 wt %:water=5:2:2), or the like can be used. Alternatively, ITO-07N (manufactured by KANTO CHEMICAL CO., INC.) may be used. The etching conditions (e.g., an etchant, etching time, and temperature) may be adjusted as appropriate depending on the material of the oxide semiconductor.

In the case of wet etching, the etchant is removed together with the etched material by cleaning. Waste liquid of the etchant including the removed material may be purified and the material contained in the waste liquid may be reused. When a material (e.g., a rare metal such as indium) contained in the oxide semiconductor film is collected from the waste liquid after the etching and reused, the resources can be efficiently used.

In this embodiment, the oxide semiconductor film is processed into the island-shaped semiconductor film 712 by wet etching with the use of a mixed solution of phosphoric acid, acetic acid, and nitric acid as an etchant.

Then, the oxide semiconductor film 712 is subjected to first heat treatment. The temperature of the first heat treatment is 400 to 750° C., preferably higher than or equal to 400° C. and lower than the strain point of the substrate. Here, after the substrate input in an electric furnace that is a kind of heat treatment apparatus, the oxide semiconductor film 712 is subjected to heat treatment at 450° C. for one hour in a nitrogen atmosphere. Thus, mixture of water or hydrogen into the oxide semiconductor film 712 is prevented and the oxide semiconductor film 712 is obtained. Through the first heat treatment, hydrogen, water, a hydroxyl group, or the like can be removed from the oxide semiconductor film 712.

Note that the heat treatment apparatus is not limited to an electric furnace, and may be provided with a device for heating an object to be processed by thermal conduction or thermal radiation from a heater such as a resistance heater. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. An inert gas (typically a rare gas such as argon) or a nitrogen gas can be used as the gas.

For example, as the first heat treatment, GRTA may be performed as follows. The substrate is transferred and put in an inert gas heated at a high temperature of 650 to 700° C., is heated for several minutes, and is transferred and taken out of the inert gas heated at the high temperature. GRTA enables high-temperature heat treatment in a short time.

In the first heat treatment, it is preferable that water, hydrogen, or the like be not contained in the atmosphere. Alternatively, the purity of a gas such as nitrogen, helium, neon, or argon which is introduced into the heat treatment apparatus is preferably 6N (99.9999%) or higher, more preferably 7N (99.99999%) or higher (that is, the impurity concentration is 1 ppm or lower, preferably 0.1 ppm or lower).

Note that depending on the condition of the first heat treatment or the material of the oxide semiconductor film, the island-shaped oxide semiconductor film 712 might be crystallized by the first heat treatment and the crystal structure thereof might be changed into a microcrystalline structure or a polycrystalline structure. For example, the oxide semiconductor film might be a microcrystalline oxide semiconductor film having a degree of crystallinity of 80% or more. Note that even when the first heat treatment is performed, the island-shaped oxide semiconductor film 712 might be an amorphous oxide semiconductor film without crystallization. The island-shaped oxide semiconductor film 712 might be an oxide semiconductor film in which a microcrystalline portion (with a grain diameter of 1 to 20 nm, typically 2 to 4 nm) is mixed into an amorphous oxide semiconductor film.

In addition, the first heat treatment performed on the oxide semiconductor film may be performed on the oxide semiconductor film which has not yet been processed into an island-shaped oxide semiconductor film. In that case, after the first heat treatment, the substrate is taken out of the heat treatment apparatus and the first photolithography process is performed. Alternatively, the first heat treatment may be performed after the source electrode and the drain electrode are formed over the oxide semiconductor film or after the gate insulating film is formed over the source electrode and the drain electrode.

Although the first heat treatment is performed mainly for the purpose of removing an impurity such as hydrogen, water, or a hydroxyl group from the oxide semiconductor film, oxygen defects might be generated in the oxide semiconductor film in the first heat treatment. Excessive oxidation treatment is therefore preferably performed after the first heat treatment. Specifically, heat treatment in an oxygen atmosphere or an atmosphere containing nitrogen and oxygen (for example, the volume ratio of nitrogen to oxygen is 4 to 1) is performed as the excessive oxidation treatment performed after the first heat treatment, for example.

Through the first heat treatment, the oxide semiconductor film is dehydrated or dehydrogenated.

Next, a conductive film is formed over the insulating film 707 and the oxide semiconductor film 712. The conductive film may be formed by sputtering or vacuum evaporation.

The conductive film is necessarily formed using a light-transmitting conductive film. As such a light-transmitting conductive film, there is a conductive metal oxide. As a conductive metal oxide, indium oxide ($In_2O_3$), tin oxide ($SnO_2$), zinc oxide (ZnO), an alloy of indium oxide and tin oxide, an alloy of indium oxide and zinc oxide ($In_2O_3$—ZnO), or the metal oxide material containing silicon or silicon oxide can be used. Further, the conductive film may have a single-layer structure or a layered structure of two or more layers.

Then, a resist is formed over the conductive film through a second photolithography process and selective etching is performed, so that the electrode 716 and the electrode 717 are formed. After that, the resist is removed (see FIG. 18B). The electrode 716 functions as one of the source electrode and the drain electrode, and the electrode 717 functions as the other of the source electrode and the drain electrode. Here, the electrode 716 and the electrode 717 are preferably etched so as to have tapered ends because coverage with the gate insulating film stacked thereover is improved. Note that the resist used for forming the electrode 716 and the electrode 717 may be formed by an inkjet method. When the resist is formed by an inkjet method, a photomask is not used; thus, manufacturing cost can be reduced.

In addition, when the substrate 700 is large, the area of a transistor to be formed later can be made large, which is preferable. When the area of the transistor is large, the channel width W of the transistor can be increased. When the channel width W of the transistor is increased, current supply capability can be improved.

Figure 18C:
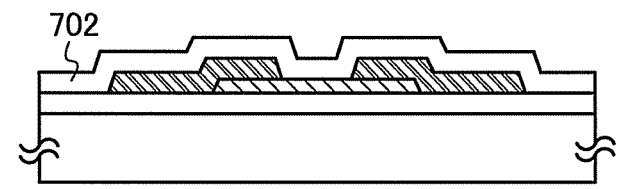

Then, the gate insulating film 702 is provided over the insulating film 707, the oxide semiconductor film 712, the electrode 716, and the electrode 717 (see FIG. 18C).

The gate insulating film 702 is formed by plasma-enhanced CVD, sputtering, or the like. Further, the gate insulating film 702 can be formed to have a single-layer structure or a layered structure including a silicon oxide film, a silicon nitride film, a silicon oxynitride film, a silicon nitride oxide film, or an aluminum oxide film.

The gate insulating film 702 is preferably formed in such a mariner that hydrogen is not contained in the gate insulating film 702. Thus, the gate insulating film 702 is preferably formed by sputtering by which hydrogen can be reduced as much as possible in an atmosphere during the deposition. In the case where a silicon oxide film is formed by sputtering, a silicon target or a quartz target is used as a target and oxygen or a mixed gas of oxygen and argon is used as a sputtering gas.

Alternatively, the gate insulating film 702 can have a structure in which a silicon oxide film and a silicon nitride film are stacked in that order from the substrate 700 side. For example, a gate insulating film may be formed in such a mariner that a silicon oxide film ($SiO_x$ (x>0)) with a thickness of 5 to 300 nm is formed as a first gate insulating film and a silicon nitride film ($SiN_y$ (y>0)) with a thickness of 50 to 200 nm is stacked as a second gate insulating film over the first gate insulating film. For example, the thickness of the gate insulating film is about 100 mm. In this embodiment, a 100-nm-thick silicon oxide film is formed by RF sputtering under a condition that the pressure is 0.4 Pa, the high-frequency power is 1.5 kW, and an atmosphere containing oxygen and argon (an oxygen flow rate of 25 sccm:an argon flow rate of 25 sccm=1:1) is used.

Figure 18D:
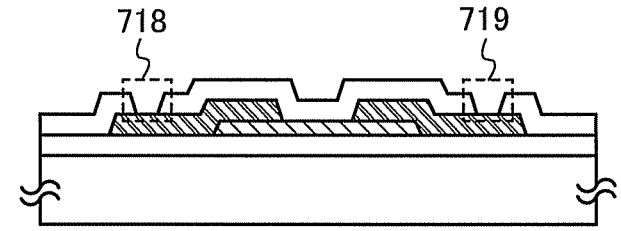

Next, a resist is formed through a third photolithography process and part of the gate insulating film 702 is removed by selective etching, so that openings 718 and 719 that reach the electrode 716 and the electrode 717, respectively, are formed (see FIG. 18D). Note that when the resist is formed by an inkjet method, a photomask is not used; thus, manufacturing cost can be reduced.

Then, a conductive film is formed over the gate insulating film 702 and the openings 718 and 719, and then, the gate electrode 711 and the wiring layers 714 and 715 are formed through a fourth photolithography process.

The gate electrode 711 and the wiring layers 714 and 715 can be formed to have a single-layer structure or a layered structure including a metal material such as molybdenum, titanium, chromium, tantalum, tungsten, aluminum, copper, neodymium, or scandium, or an alloy material containing any of these materials as a main component. Specific examples of a two-layer structure of the gate electrode 711 and the first wiring layers 714 and 715 include a structure in which a molybdenum layer is stacked over an aluminum layer, a structure in which a molybdenum layer is stacked over a copper layer, a structure in which a titanium nitride layer or a tantalum nitride layer is stacked over a copper layer, and a structure in which a molybdenum layer is stacked over a titanium nitride layer. As a specific example of a three-layer structure, there is a structure in which a tungsten layer (or a tungsten nitride layer), an alloy layer of aluminum and silicon (or an alloy layer of aluminum and titanium), and a titanium nitride layer (or a titanium layer) are stacked.

Note that the gate electrode 711 and the wiring layers 714 and 715 can be formed using a light-transmitting conductive film.

As the light-transmitting conductive film, there is a conductive metal oxide. As a conductive metal oxide, indium oxide ($In_2O_3$), tin oxide ($SnO_2$), zinc oxide (ZnO), an alloy of indium oxide and tin oxide, an alloy of indium oxide and zinc oxide ($In_2O_3$—ZnO), or the metal oxide material containing silicon or silicon oxide can be used. Further, the conductive film may have a single-layer structure or a layered structure of two or more layers.

Next, second heat treatment (preferably at 200 to 400° C., for example, 250 to 350° C.) is performed in an inert gas atmosphere or an oxygen gas atmosphere. In this embodiment, the second heat treatment is performed at 250° C. for one hour in a nitrogen atmosphere. Note that the second heat treatment may be performed after a protective insulating film or a planarization insulating film is formed over the transistor 710.

Heat treatment may be further performed at 100 to 200° C. for 1 to 30 hours in an air atmosphere. This heat treatment may be performed at a fixed heating temperature. Alternatively, the following change in the heating temperature may be conducted plural times repeatedly: the heating temperature is increased from room temperature to a temperature of 100 to 200° C. and then decreased to room temperature.

Figure 18E:
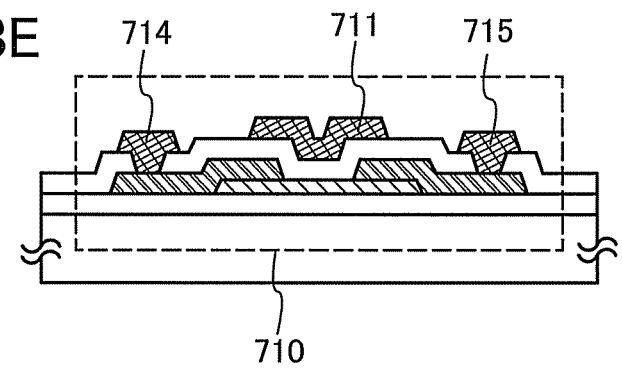

Through the above steps, the transistor 710 including the high-purity oxide semiconductor film 712 whose concentration of hydrogen, moisture, hydride, or hydroxide is lowered can be formed (see FIG. 18E).

A protective insulating film or a planarization insulating film for planarization may be provided over the transistor 710. The protective insulating film can be formed to have a single-layer structure or a layered structure including a silicon oxide film, a silicon nitride film, a silicon oxynitride film, a silicon nitride oxide film, or an aluminum oxide film. The planarization insulating film can be formed using a heat-resistant organic material such as polyimide, acrylic, benzocyclobutene, polyamide, or epoxy. Other than such organic materials, it is possible to use a low-dielectric constant material (a low-k material), a siloxane-based resin, PSG (phosphosilicate glass), BPSG (borophosphosilicate glass), or the like. Alternatively, the planarization insulating film may be formed by stacking a plurality of insulating films including these materials.

Here, a siloxane-based resin corresponds to a resin including a Si—O—Si bond that includes a siloxane-based material as a starting material. The siloxane-based resin may include an organic group (e.g., an alkyl group or an aryl group) as a substituent. Further, the organic group may include a fluoro group.

There is no particular limitation on the method for forming the planarization insulating film. The planarization insulating film can be formed, depending on the material, by a method such as sputtering, an SOG method, a spin coating method, a dipping method, a spray coating method, or a droplet discharge method (e.g., an inkjet method, screen printing, or offset printing), or a tool such as a doctor knife, a roll coater, a curtain coater, or a knife coater.

When moisture remaining in a reaction atmosphere is removed at the time of the deposition of the oxide semiconductor film as described above, the concentration of hydrogen and hydride in the oxide semiconductor film can be lowered.

Figure 19A:
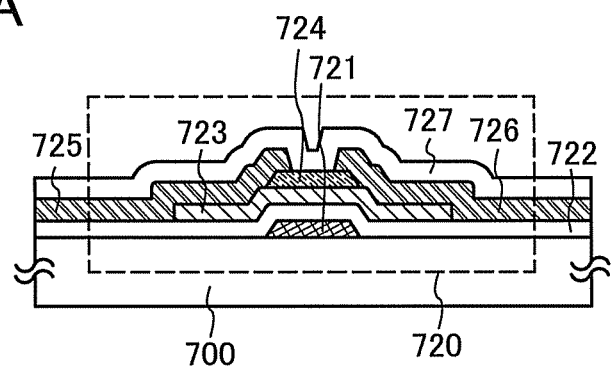
FIGS. 19A to 19C are cross-sectional views of transistors.
Figure 19B:
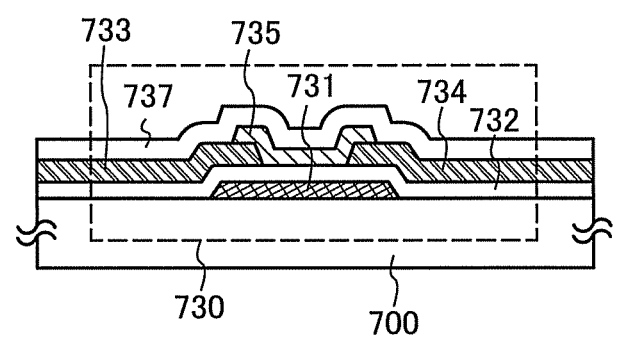
Figure 19C:
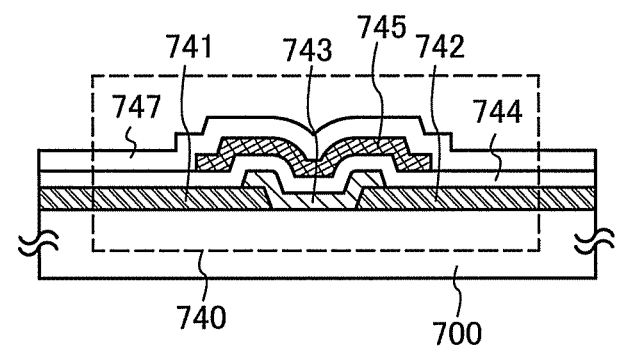

Next, FIGS. 19A to 19C each illustrate a structure example of a transistor including a high-purity oxide semiconductor that is different from the structure of the transistor in FIGS. 17A and 17B.

A transistor 720 illustrated in FIG. 19A is a bottom-gate transistor. The transistor 720 includes a gate electrode 721 provided over the substrate 700, a gate insulating film 722 provided over the gate electrode 721, an oxide semiconductor film 723 which is provided over the gate insulating film 722 and overlaps with the gate electrode 721, a channel protective film 724 which is provided over the oxide semiconductor film 723 and overlaps with the gate electrode 721, and conductive films 725 and 726 which are provided over the oxide semiconductor film 723. In addition, the transistor 720 may include an insulating film 727 provided over the oxide semiconductor film 723. The transistor 720 can be referred to as a top-contact transistor because the conductive films 725 and 726 that are a source electrode and a drain electrode are in contact with an upper surface of the oxide semiconductor film 723 that includes a channel formation region.

The channel protective film 724 can prevent damage (e.g., reduction in thickness due to plasma or an etchant at the time of etching) of a portion of the oxide semiconductor film 723 that is to be a channel formation region, in a later step. Thus, the reliability of the transistor can be improved.

The channel protective film 724 can be formed using an inorganic material that contains oxygen (e.g., silicon oxide, silicon oxynitride, silicon nitride oxide, aluminum oxide, or aluminum oxynitride). The channel protective film 724 can be formed by vapor deposition such as plasma-enhanced CVD or thermal CVD, or sputtering. After the deposition of the channel protective film 724, the channel protective film 724 is produced by etching. In this embodiment, the channel protective film 724 is formed in such a manner that a silicon oxide film is formed by sputtering and produced by etching with the use of a mask formed by photolithography.

In addition, when the channel protective film 724 is formed in contact with the oxide semiconductor film 723, the resistance of a region in the oxide semiconductor film 723 that is in contact with the channel protective film 724 is increased and serves as a high-resistant oxide semiconductor region. By the formation of the channel protective film 724, the oxide semiconductor film 723 can have the high-resistant oxide semiconductor region in the vicinity of an interface between the oxide semiconductor film 723 and the channel protective film 724.

Note that the transistor 720 may further include a back gate electrode over the insulating film 727. The back gate electrode is formed so as to overlap with a channel formation region in the oxide semiconductor film 723. Further, the back gate electrode may be electrically insulated and in a floating state, or may be supplied with a potential. In the latter case, the back gate electrode may be supplied with the same potential as the gate electrode 721 or a fixed potential such as a ground potential. When the level of the potential supplied to the back gate electrode is controlled, the threshold voltage of the transistor 720 can be controlled.

A transistor 730 illustrated in FIG. 19B is a bottom-gate transistor. The transistor 730 includes a gate electrode 731 provided over the substrate 700, a gate insulating film 732 provided over the gate electrode 731, conductive films 733 and 734 which are provided over the gate insulating film 732, and an oxide semiconductor film 735 which overlaps with the gate electrode 731. In addition, the transistor 730 may include an insulating film 737 provided over the oxide semiconductor film 735. The transistor 730 can be referred to as a bottom-contact transistor because the conductive films 733 and 734 that are a source electrode and a drain electrode are in contact with a bottom surface of the oxide semiconductor film 735 that includes a channel formation region.

Further, in the case of the bottom-contact transistor 730, the thickness of each of the conductive films 733 and 734 is preferably small in order to prevent disconnection of the oxide semiconductor film 735 to be formed later. Specifically, the thickness of each of the conductive films 733 and 734 is 10 to 200 nm, preferably 50 to 75 nm.

Note that the transistor 730 may further include a back gate electrode over the insulating film 737. The back gate electrode is formed so as to overlap with a channel formation region in the oxide semiconductor film 735. The back gate electrode may be electrically insulated and in a floating state, or may be supplied with a potential. In the latter case, the back gate electrode may be supplied with the same potential as the gate electrode 731 or a fixed potential such as a ground potential. When the level of the potential supplied to the back gate electrode is controlled, the threshold voltage of the transistor 730 can be controlled.

A transistor 740 illustrated in FIG. 19C is a top-gate transistor. The transistor 740 includes conductive films 741 and 742 provided over the substrate 700, an oxide semiconductor film 743 provided over the conductive films 741 and 742, a gate insulating film 744 over the oxide semiconductor film 743, and a gate electrode 745 which is over the gate insulating film 744 and overlaps with the oxide semiconductor film 743. In addition, the transistor 740 may include an insulating film 747 provided over the gate electrode 745. The transistor 740 can be referred to as a bottom-contact transistor because the conductive films 741 and 742 that are a source electrode and a drain electrode are in contact with a bottom surface of the oxide semiconductor film 743 that includes a channel formation region.

Further, in the case of the top-gate transistor 740, the thickness of each of the conductive films 741 and 742 is preferably small in order to prevent disconnection of the oxide semiconductor film 743 to be formed later. Specifically, the thickness of each of the conductive films 741 and 742 is 10 to 200 nm, preferably 50 to 75 nm.

Each of the transistors 710, 720, 730, and 740 including the oxide semiconductor films as the channel formation regions is preferably used as the transistor 302 in the voltage conversion element 301 because it has high withstand voltage.

Note that the structure of the transistor 302 in the voltage conversion element 301 is not limited to the structure of each of the transistors 710, 720, 730, and 740. For example, a power MOS (MIS) FET is preferably used as the transistor 302 or 312 because it has higher withstand voltage.

Thus, the first voltage conversion element 103 for converting the output voltage of the first photoelectric conversion element 101 and the second voltage conversion element 104 for converting the output voltage of the second photoelectric conversion element 102 can be obtained. According to this embodiment, the first voltage conversion element 103 and the second voltage conversion element 104 can be obtained using transistors with high withstand voltage including oxide semiconductor films in channel formation regions.

As described above, in the photoelectric conversion device in this embodiment, generation of ripple voltage can be suppressed. In addition, in the photoelectric conversion device in this embodiment, the decrease in output voltage can be suppressed.

Embodiment 2

In this embodiment, a circuit structure example of a photoelectric conversion device in which voltage conversion elements are added to the photoelectric conversion device in Embodiment 1 is described with reference to FIG. 14 and FIG. 16. The output voltage from the photoelectric conversion device in Embodiment 1 is converted into voltage which is suitable for the operation of a different device by the added voltage conversion elements.

Figure 16:
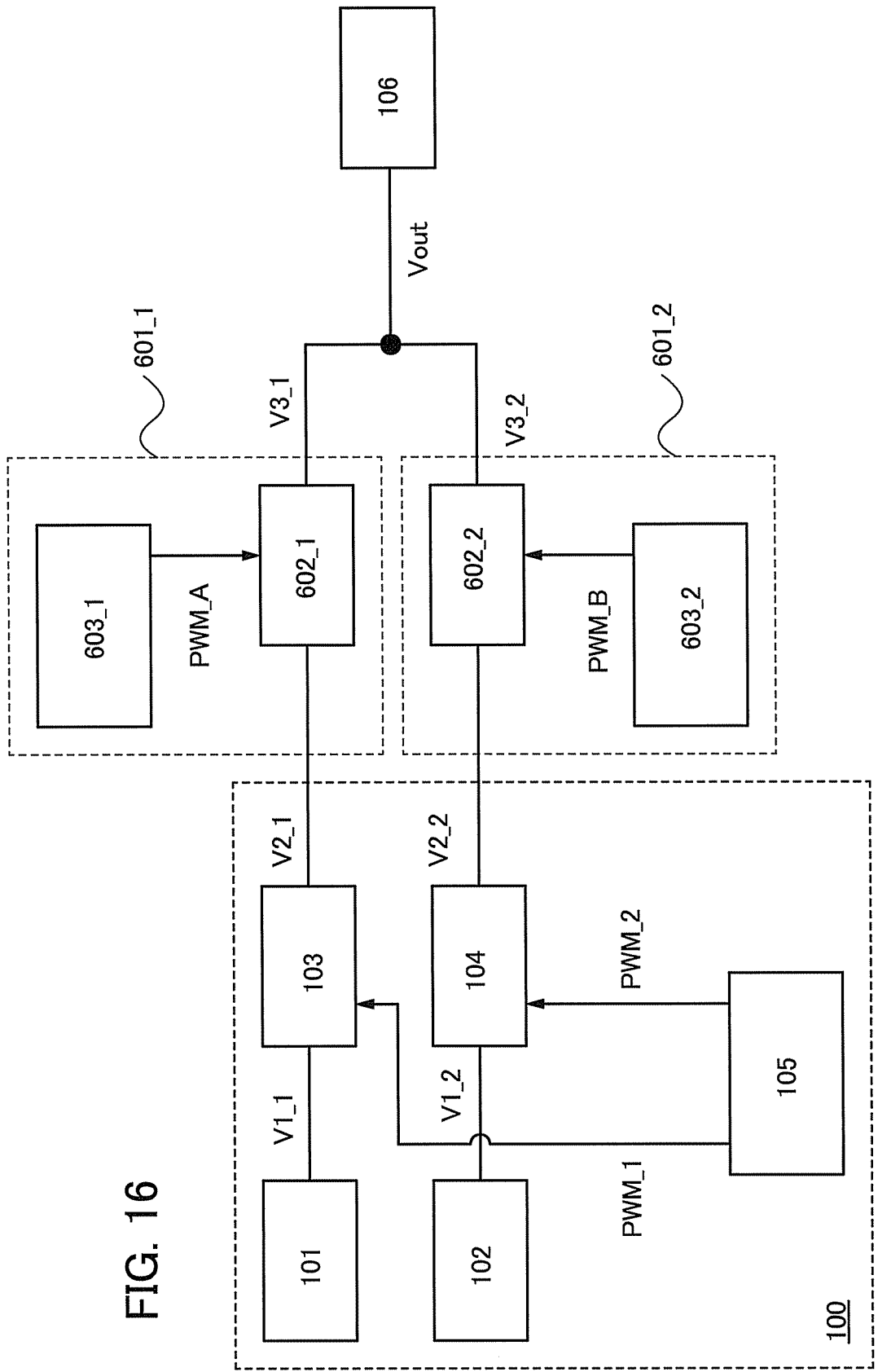
FIG. 16 is a block diagram of a photoelectric conversion device.

FIG. 16 illustrates the photoelectric conversion device 100, a voltage conversion element 601_1, a voltage conversion element 601_2, and the external circuit 106. The photoelectric conversion device 100 and the external circuit 106 in FIG. 16 are similar to those in FIG. 1.

The voltage conversion element 601_1 is connected to the first voltage conversion element 103 connected to the first photoelectric conversion element 101. In addition, the voltage conversion element 601_2 is connected to the second voltage conversion element 104 connected to the second photoelectric conversion element 102.

The voltage V2_1 converted by the voltage conversion element 103 is input to the voltage conversion element 601_1. The voltage V2_1 input to the voltage conversion element 601_1 is converted into voltage V3_1 by the voltage conversion element 601_1. Similarly, the voltage V2_2 converted by the voltage conversion element 104 is input to the voltage conversion element 601_2. The voltage V2_2 input to the voltage conversion element 601_2 is converted into voltage V3_2 by the voltage conversion element 6012.

The voltage V3_1 output from the voltage conversion element 601_1 and the voltage V3_2 output from the voltage conversion element 601_2 are added and output outside as the output voltage Vout.

The voltage conversion element 601_1 includes a voltage conversion circuit 602_1 and a control circuit 603_1 of the voltage conversion circuit 602_1. In addition, the voltage conversion element 601_2 includes a voltage conversion circuit 602_2 and a control circuit 603_2 of the voltage conversion circuit 602_2. The voltage conversion circuit 602_1 is controlled with a PWM signal PWM_A from the control circuit 603_1. The voltage conversion circuit 602_2 is controlled with a PWM signal PWM_B from the control circuit 603_2.

Figure 14:
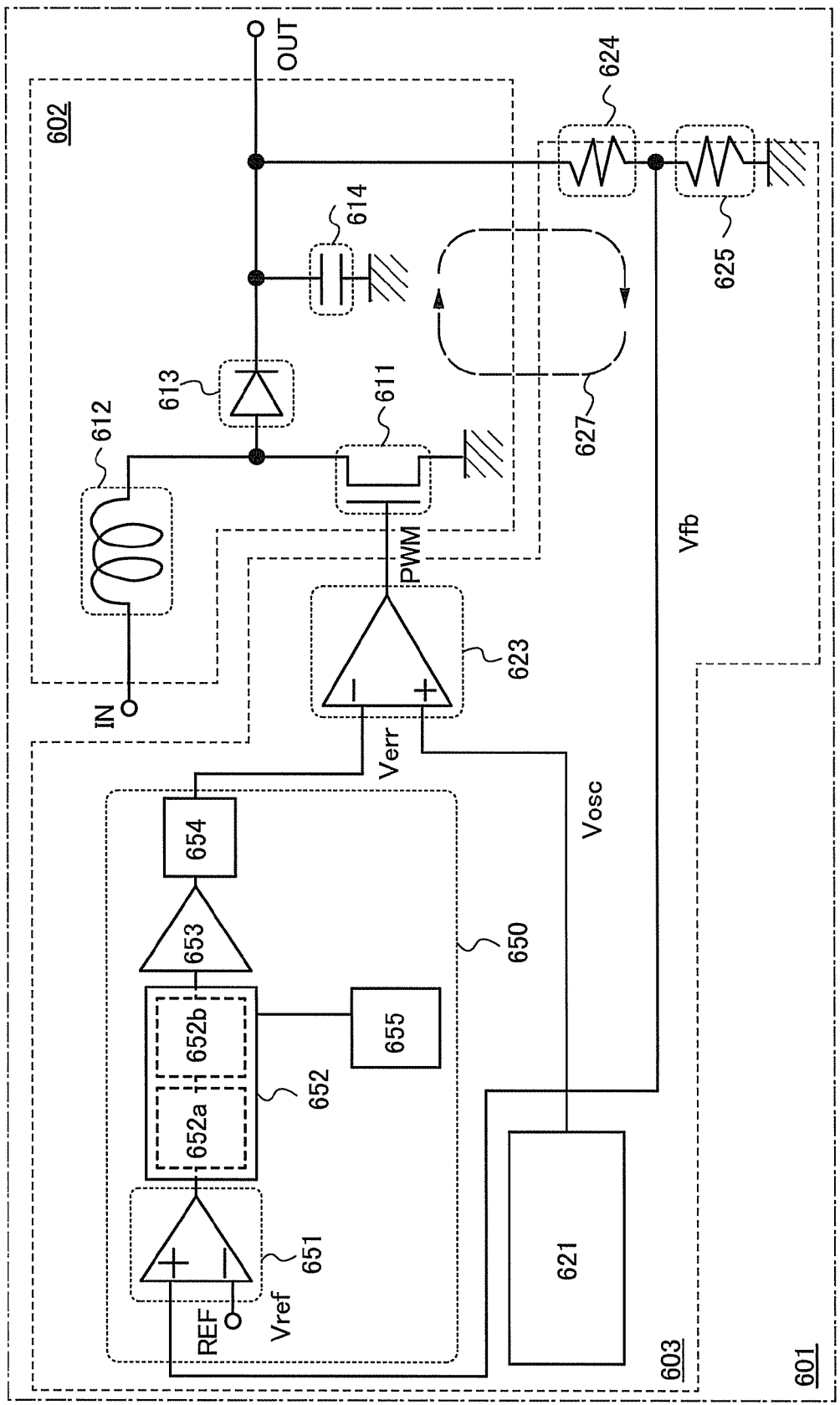
FIG. 14 is a circuit diagram of a voltage conversion element.

FIG. 14 illustrate a structure example of the voltage conversion element 601_1 and the voltage conversion element 601_2 illustrated in FIG. 16. Note that a voltage conversion element 601 illustrated in FIG. 14 corresponds to the voltage conversion element 601_1 and the voltage conversion element 601_2 illustrated in FIG. 16. A voltage conversion circuit 602 illustrated in FIG. 14 corresponds to the voltage conversion circuit 602_1 and the voltage conversion circuit 602_2 illustrated in FIG. 16. A control circuit 603 illustrated in FIG. 14 corresponds to the control circuit 603_1 and the control circuit 603_2 illustrated in FIG. 16. Further, a pulse width modulation signal PWM illustrated in FIG. 14 corresponds to the PWM signal PWM_A and the PWM signal PWM_B illustrated in FIG. 16.

The voltage conversion element 601 illustrated in FIG. 14 includes the voltage conversion circuit 602 and the control circuit 603 of the voltage conversion circuit 602. FIG. 14 illustrates a DC-DC converter as an example of the voltage conversion circuit 602.

The voltage conversion circuit 602 includes a transistor 611, a coil 612, a diode 613, and a capacitor 614. The control circuit 603 includes a triangle-wave generation circuit 621, a digital control circuit 650, a pulse width modulation output driver 623, a resistor 624, and a resistor 625. A dotted arrow 627 indicates the loop of a feedback circuit. Feedback voltage Vfb that is the output voltage of the resistor 624 is input to the digital control circuit 650.

The digital control circuit 650 includes a comparator 651, a digital arithmetic processing circuit 652, a pulse width modulation output driver 653, and a low pass filter (LPF) 654.

In the digital control circuit 650, the digital arithmetic processing circuit 652 and the pulse width modulation output driver 653 are digital circuits. The digital circuit judges whether a signal passing through a circuit is 1 or 0 (zero) from the level of the signal with respect to the reference. Since the digital circuit judges whether the signal is 1 or 0 (zero), adequate processing is possible even when the characteristic of an element included in the digital circuit fluctuates.

The digital control circuit 650 suppresses the use of a passive element whose area is large (e.g., a capacitor or a resistor); thus, the area of the circuit can be reduced, which is preferable.

The comparator 651 compares reference voltage Vref input from an inversion input terminal REF and the feedback voltage Vfb input from a non-inversion input terminal with each other and outputs an H-level (high-level) digital signal or an L-level (low-level) digital signal, i.e., a digital signal that is 1 or 0 (zero).

The digital arithmetic processing circuit 652 includes a digital averaging integrator 652a and a digital pulse width modulator 652b. A clock divider 655 is connected to the digital arithmetic processing circuit 652 from the outside, and a clock signal from the clock divider 655 is input to the digital arithmetic processing circuit 652.

The digital arithmetic processing circuit 652 performs averaging treatment, integration treatment, and digital pulse width modulation treatment on a digital signal output from the comparator 651. In the digital arithmetic processing circuit 652, the digital averaging integrator 652a performs averaging treatment and integration treatment, and the digital pulse width modulator 652b performs digital pulse width modulation treatment.

The digital arithmetic processing circuit 652 holds an N-bit digital signal (whose level is H (high) or L (low)) output from the comparator 651, compares the number of H levels and the number of L levels with each other, and outputs a signal whose number of levels is larger. Thus, the digital signal is averaged.

In accordance with the averaged digital signal, integration is performed by addition of "−1" when the level of the signal is H, and integration is performed by addition of "+1" when the level of the signal is L. Thus, the averaged digital signal is integrated.

The position of a phase in pulse width modulation is set in accordance with the integrated digital signal. Thus, digital pulse width modulation treatment is performed. A pulse width modulation output signal on which the digital pulse width modulation treatment is performed is input to the pulse width modulation output driver 653.

The triangle-wave generation circuit 621 generates a triangle wave Vosc which is necessary for a pulse width modulation generation signal.

An output signal Verr of the digital control circuit 650 is input to an inversion input terminal of the pulse width modulation output driver 623, and the triangle wave Vosc generated by the triangle-wave generation circuit 621 is input to a non-inversion input terminal of the pulse width modulation output driver 623.

The pulse width modulation output driver 623 compares the output signal Verr of the digital control circuit 650 and the triangle wave Vosc with each other and outputs an H-level (high-level) signal to the transistor 611 as the pulse width modulation signal PWM when the signal level of the triangle wave Vosc is higher than that of the output signal Verr of the digital control circuit 650. In contrast, when the signal level of the triangle wave Vosc is lower than that of the output signal Verr of the digital control circuit 650, the pulse width modulation output driver 623 outputs an L-level (low-level) signal to the transistor 611 as the pulse width modulation signal (the PWM signal PWM).

In the photoelectric conversion device in this embodiment, generation of ripple voltage can be suppressed. In addition, in the photoelectric conversion device in this embodiment, the decrease in output voltage can be suppressed. Further, according to this embodiment, it is possible to obtain a photoelectric conversion device which includes not only a control element for performing MPPT but also a control element for controlling voltage so that the voltage is suitable for the operation of a different device.

Embodiment 3

In this embodiment, a photovoltaic module is obtained using the photoelectric conversion device described in Embodiment 1 or 2. An example in which the obtained photovoltaic module is mounted on an electric propulsion car is described.

FIGS. 12A and 12B, FIG. 21, FIGS. 22A and 22B, and FIGS. 23A and 23B illustrate the example of the photovoltaic module in this embodiment. The photovoltaic module in this embodiment is manufactured using the photoelectric conversion device described in Embodiment 1 or 2.

Figure 21:
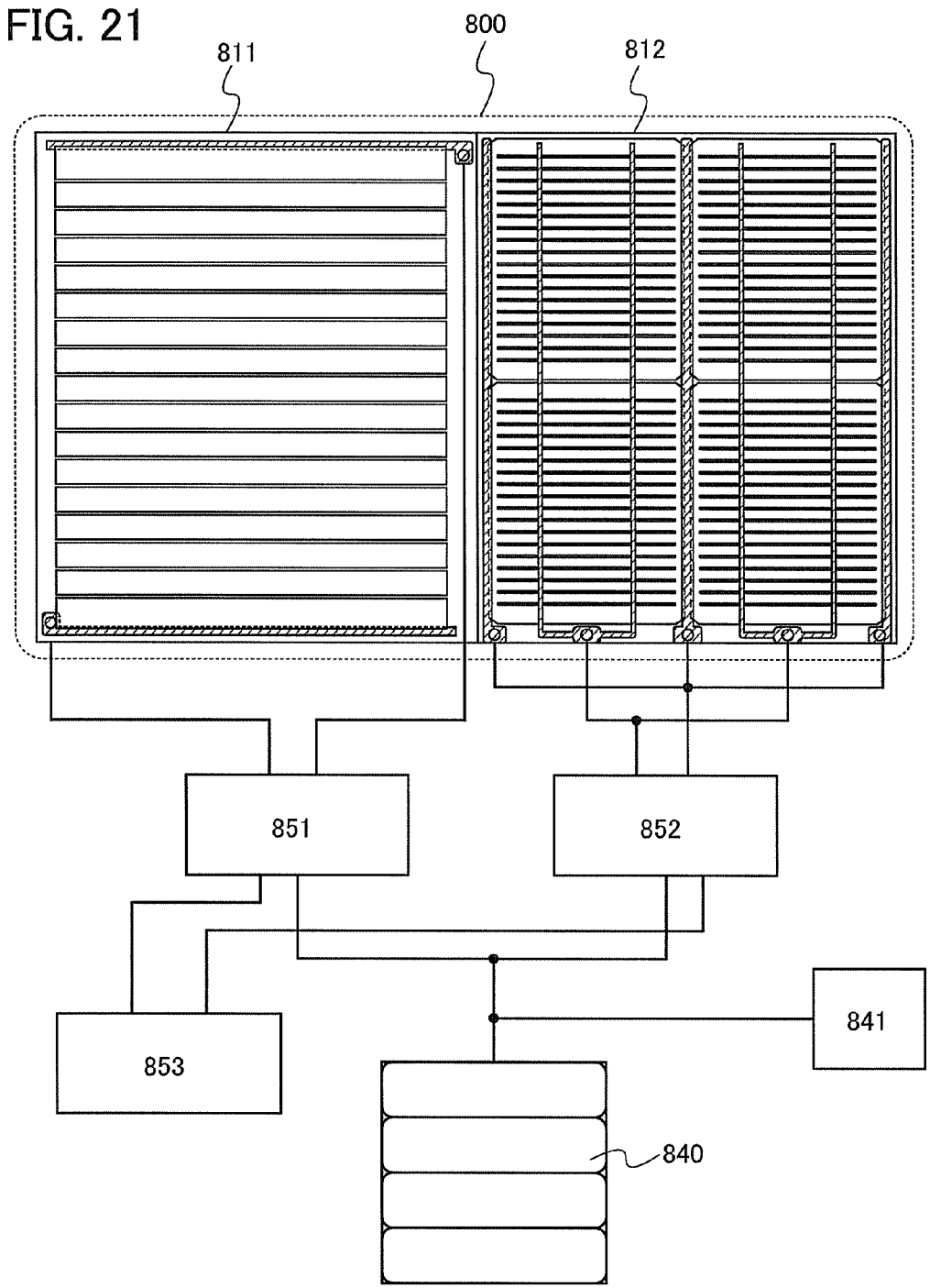
FIG. 21 is a block diagram of a photovoltaic module.

FIG. 21 illustrates an example of a photovoltaic system which includes a photovoltaic module 800 having a plurality of photovoltaic modules. FIG. 21 illustrates two photovoltaic modules (a photovoltaic module 811 and a photovoltaic module 812) as the photovoltaic module 800. Note that the example in which the number of photovoltaic modules is two is described in this embodiment; however, the number of photovoltaic modules is not limited to two, and may be three or more. As the number of photovoltaic modules increases, electric power generated increases.

A voltage conversion circuit 851 including a DC-DC converter or the like is connected to the photovoltaic module 811. The output voltage of the photovoltaic module 811 is raised or lowered by the voltage conversion circuit 851.

A voltage conversion circuit 852 including a DC-DC converter or the like is connected to the photovoltaic module 812. The output voltage of the photovoltaic module 812 is raised or lowered by the voltage conversion circuit 852.

A control circuit 853 is connected to the voltage conversion circuit 851 and the voltage conversion circuit 852. The control circuit 853 performs MPPT on the voltage conversion circuit 851 and the voltage conversion circuit 852 so as to obtain the maximum electric power of the photovoltaic module 811 and the maximum electric power of the photovoltaic module 812.

In addition, the control circuit 853 controls output voltage from the voltage conversion circuit 851 and output voltage from the voltage conversion circuit 852 and stores electricity in a storage battery 840. Further, in the case where electricity is sufficiently stored in the storage battery 840, the control circuit 853 controls electric power supplied from the photovoltaic module 800 so that the electric power is directly output to an external circuit 841.

The plurality of photovoltaic modules 800 are manufactured using the photoelectric conversion device described in Embodiment 1 or 2. In this embodiment, the solar cell including an amorphous semiconductor layer as the photoelectric conversion layer 211 described in Embodiment 1 (see FIG. 10) is used as an example of the photovoltaic module 811. The solar cell including a single crystal semiconductor layer as the photoelectric conversion layer 415 described in Embodiment 1 (see FIG. 13) is used as an example of the photovoltaic module 812. Note that the photovoltaic module 811 or the photovoltaic module 812 is not limited to the solar cell, and may be the different solar cell described in Embodiment 1.

When an electric double layer capacitor is used as the storage battery 840, the storage battery 840 does not need chemical reaction in charging; thus, electricity can be stored in the storage battery 840 rapidly. Further, lifetime can be increased about eight times and charging and discharging efficiency can be increased about 1.5 times compared with those of a lead storage battery or the like which uses chemical reaction. The photovoltaic system described in this embodiment can be used in a variety of external circuits 841 which use electric power, such as lighting or electronic devices.

Figure 12A:
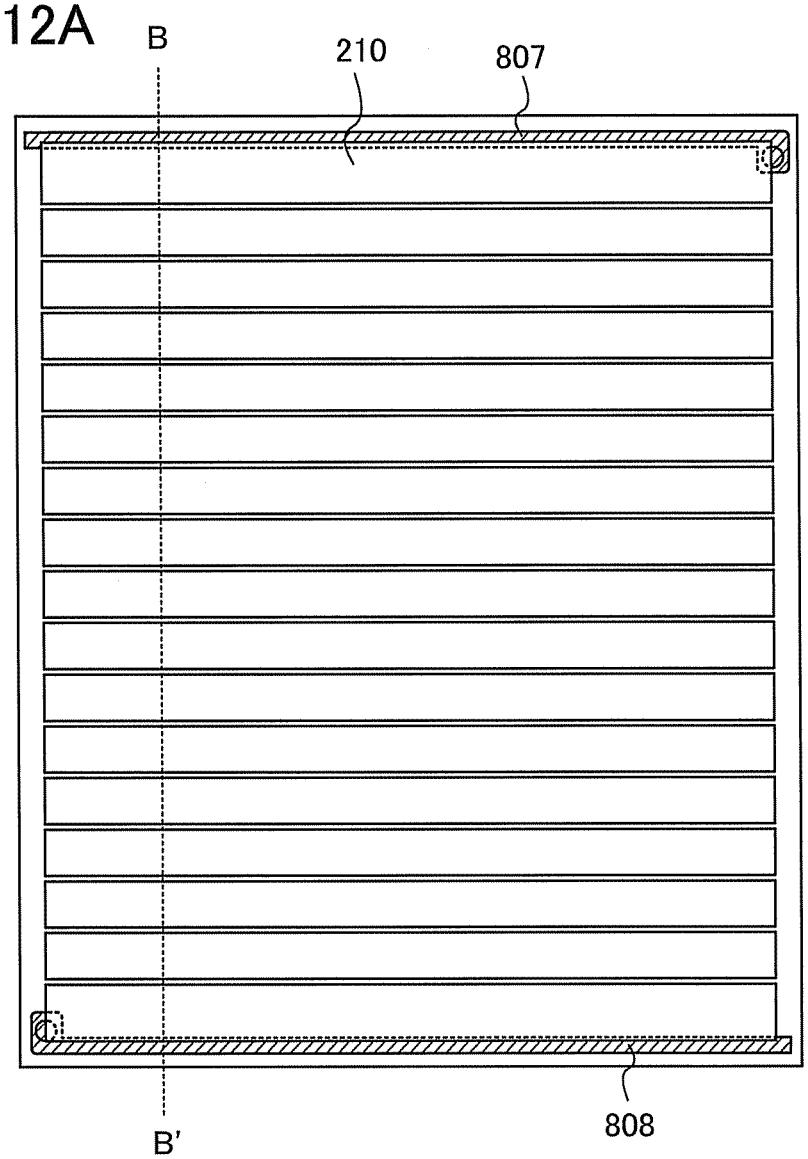
FIGS. 12A and 12B are a top view and a cross-sectional view of a photovoltaic module.
Figure 12B:
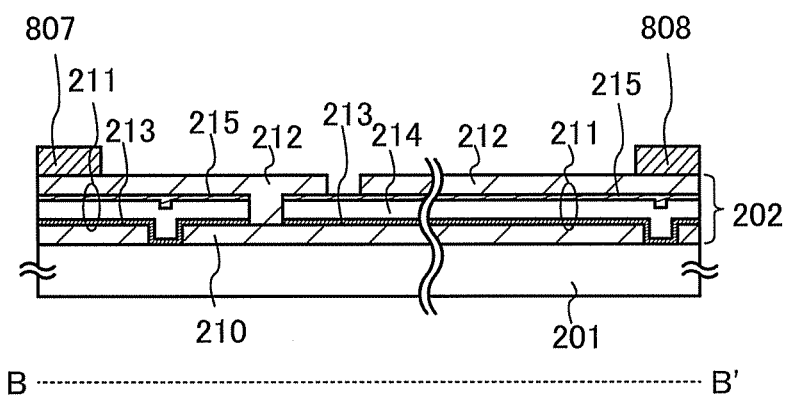

FIGS. 12A and 12B illustrate a structure example of the photovoltaic module 811.

The photovoltaic module 811 is the solar cell including an amorphous semiconductor layer as the photoelectric conversion layer 211 described in Embodiment 1. In FIGS. 12A and 12B, components that are the same as the components in FIG. 10 are denoted by the same reference numerals. FIG. 12B is a cross-sectional view taken along B-B' in FIG. 12A.

An auxiliary electrode 807 and an auxiliary electrode 808 are formed in contact with the conductive film 212 provided over the photoelectric conversion layer 211. Each of the auxiliary electrode 807 and the auxiliary electrode 808 is electrically connected to the conductive film 212 in a cell at the farthest end.

Figure 22A:
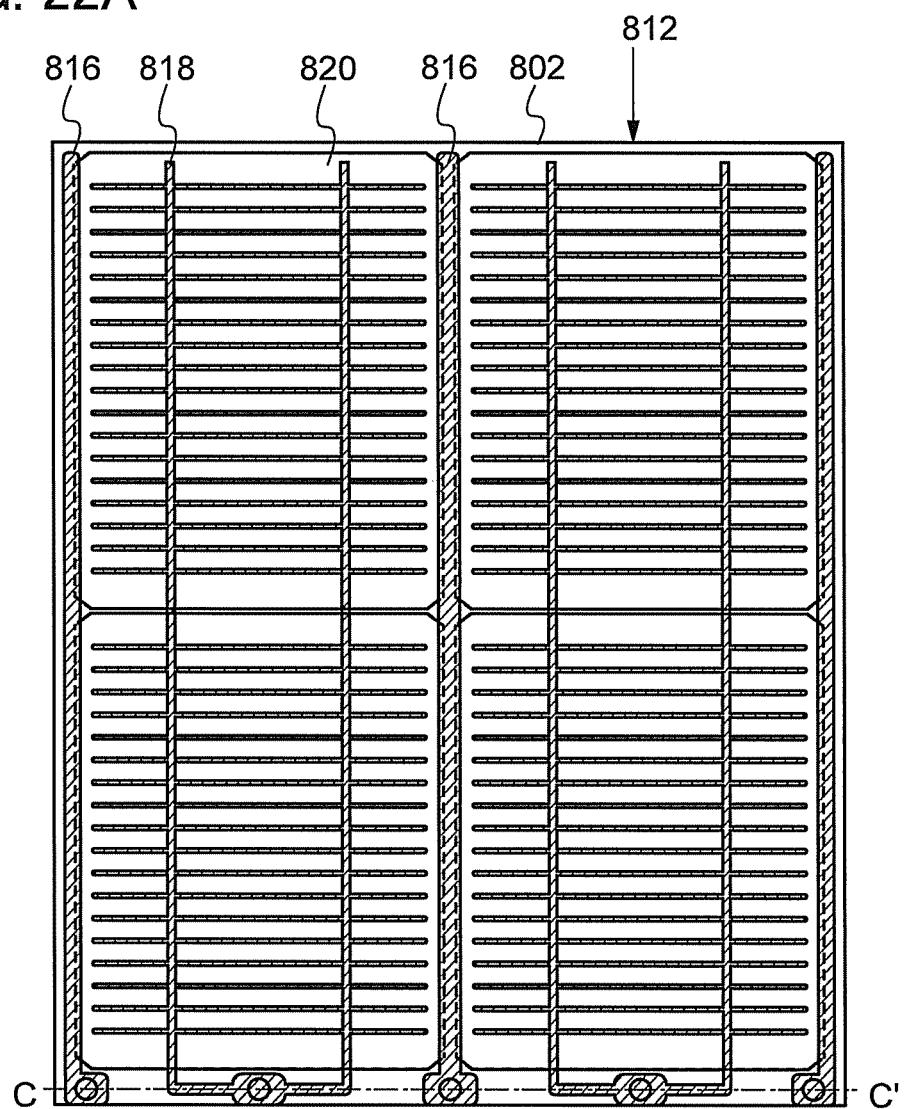
FIGS. 22A and 22B are a top view and a cross-sectional view of a photovoltaic module.
Figure 22B:
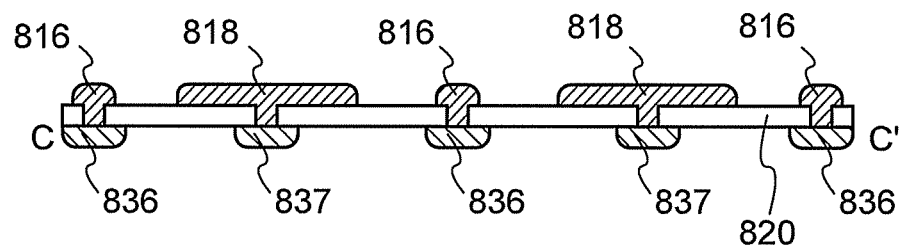

FIGS. 22A and 22B illustrate a structure example of the photovoltaic module 812.

The photovoltaic module 812 includes a photoelectric conversion layer 820 provided over a support substrate 802. Between the support substrate 802 and the photoelectric conversion layer 820, an insulating layer and a first electrode are provided from the support substrate 802 side. Further, the first electrode is connected to the auxiliary electrode 816.

The auxiliary electrode 816 and a second electrode 818 are formed on one surface side of the support substrate 802 (a side where the photoelectric conversion layer 820 is formed) and are connected to a back electrode 836 and a back electrode 837 which are used for an external terminal connector, respectively, at ends of the support substrate 802. FIG. 22B is a cross-sectional view taken along C-C' in FIG. 22A. The auxiliary electrode 816 and the second electrode 818 are connected to the back electrode 836 and the back electrode 837, respectively, via through holes of the support substrate 802.

In this embodiment, the photoelectric conversion layer 415 including a single crystal semiconductor layer is used as the photoelectric conversion layer 820.

Figure 23A:
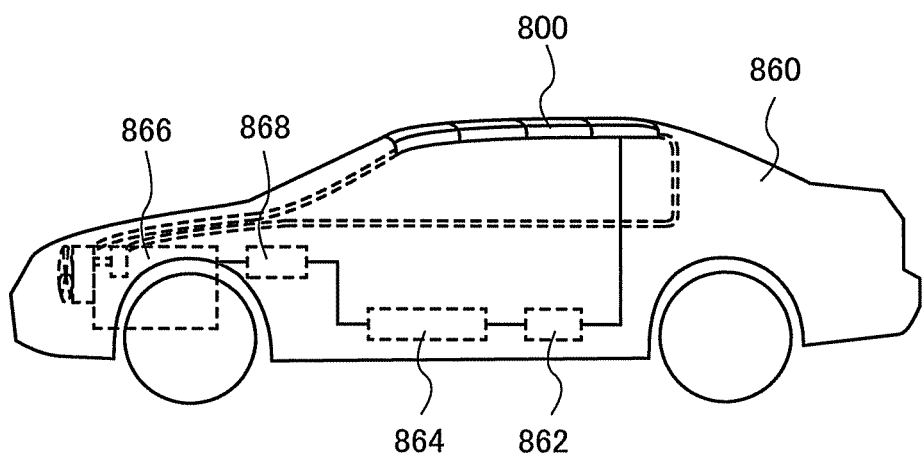
FIGS. 23A and 23B illustrate an electric propulsion ear on which a photovoltaic module is mounted.
Figure 23B:
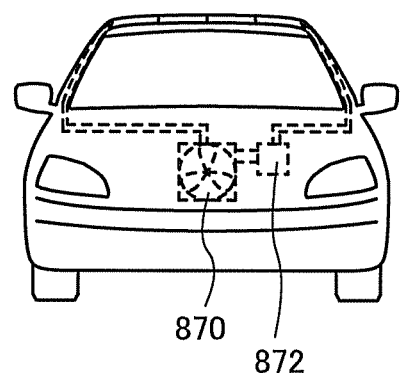

FIGS. 23A and 23B illustrate an example of an electric propulsion car 860 in which the photovoltaic module 800 illustrated in FIG. 21 is mounted on its roof portion. The photovoltaic module 800 is connected to a battery or a capacitor 864 through a converter 862. In other words, electricity is stored in the battery or the capacitor 864 with the use of electric power supplied from the photovoltaic module 800. Charging and discharging may be selected in accordance with the operation condition of an engine 866 which is monitored by a monitor 868.

The photoelectric conversion efficiency of the photovoltaic module 800 tends to be decreased by heat. In order to suppress such a decrease in photoelectric conversion efficiency, liquid for cooling or the like may be circulated in the photovoltaic module 800. For example, cooling water in a radiator 870 may be circulated by a circulation pump 872. Needless to say, this embodiment is not limited to the structure in which the liquid for cooling is shared by the photovoltaic module 800 and the radiator 870. In the case where the decrease in photoelectric conversion efficiency is not serious, the liquid does not need to be circulated.

In the photoelectric conversion device in this embodiment, generation of ripple voltage can be suppressed. In addition, in the photoelectric conversion device in this embodiment, the decrease in output voltage can be suppressed. Since a photovoltaic module including the photoelectric conversion device can be mounted, a highly reliable electric propulsion car can be obtained, which is preferable.

This application is based on Japanese Patent Application serial No. 2010-107536 filed with Japan Patent Office on May 7, 2010, the entire contents of which are hereby incorporated by reference.

What is claimed is:

1. A photoelectric conversion device comprising:
a first photoelectric conversion element;
a first voltage conversion element for converting output voltage of the first photoelectric conversion element;
a second photoelectric conversion element;
a second voltage conversion element for converting output voltage of the second photoelectric conversion element; and
a control element for controlling timing of the first voltage conversion element and the second voltage conversion element,
wherein each of the first photoelectric conversion element and the second photoelectric conversion element includes any one of an amorphous semiconductor film, a microcrystalline semiconductor film, and a single crystal semiconductor film,
wherein the first voltage conversion element comprises a first transistor, the first transistor configured to be turned on with a first signal output from the control element,
wherein the second voltage conversion element comprises a second transistor, the second transistor configured to be turned on with a second signal output from the control element,
wherein a first time period when a level of the first signal is high and a second time period when a level of the second signal is high do not overlap with each other, and
wherein the first time period is longer than the second time period.

2. The photoelectric conversion device according to claim 1,
wherein each of the first photoelectric conversion element and the second photoelectric conversion element is a solar cell.

3. The photoelectric conversion device according to claim 1,
wherein the first photoelectric conversion element and the second photoelectric conversion element are stacked.

4. The photoelectric conversion device according to claim 1,
wherein first voltage output from the first voltage conversion element and second voltage output from the second voltage conversion element are added and output as an output voltage of the photoelectric conversion device.

5. A photoelectric conversion device comprising:
a first solar cell;
a first voltage conversion element for converting output voltage of the first solar cell;
a second solar cell;
a second voltage conversion element for converting output voltage of the second solar cell; and
a control element for controlling timing of the first voltage conversion element and the second voltage conversion element,
wherein each of the first solar cell and the second solar cell is any one of a solar cell including an amorphous silicon film, a solar cell including a single crystal silicon film, a hetero-junction with intrinsic thin-layer (HIT) solar cell, a CIG-based thin film solar cell, a CdTe solar cell, an organic thin film solar cell, and a dye sensitization solar cell,
wherein the first voltage conversion element comprises a first transistor, the first transistor configured to be turned on with a first signal output from the control element,
wherein the second voltage conversion element comprises a second transistor, the second transistor configured to be turned on with a second signal output from the control element,
wherein a first time period when a level of the first signal is high and a second time period when a level of the second signal is high do not overlap with each other, and
wherein a cycle time of the second signal is half of a cycle time of the first signal.

6. The photoelectric conversion device according to claim 5,
wherein the first solar cell and the second solar cell are stacked.

7. The photoelectric conversion device according to claim 5,
wherein first voltage output from the first voltage conversion element and second voltage output from the second voltage conversion element are added and output as an output voltage of the photoelectric conversion device.

8. A photoelectric conversion device comprising:
a first solar cell;
a first DC-DC converter for converting output voltage of the first solar cell;
a second solar cell;
a second DC-DC converter for converting output voltage of the second solar cell; and
a control element for controlling timing of the first DC-DC converter and the second DC-DC converter,
wherein each of the first solar cell and the second solar cell is any one of a solar cell including an amorphous silicon film, a solar cell including a single crystal silicon film, a hetero junction with intrinsic thin-layer (HIT) solar cell, a CIG-based thin film solar cell, a CdTe solar cell, an organic thin film solar cell, and a dye sensitization solar cell,
wherein the first DC-DC converter comprises a first transistor, the first transistor configured to be turned on with a first signal output from the control element,
wherein the second DC-DC converter comprises a second transistor, the second transistor configured to be turned on with a second signal output from the control element,
wherein a first time period when a level of the first signal is high and a second time period when a level of the second signal is high do not overlap with each other, and
wherein the first time period is longer than the second time period.

9. The photoelectric conversion device according to claim 8,
wherein the first solar cell and the second solar cell are stacked.

10. The photoelectric conversion device according to claim 8,
wherein first voltage output from the first DC-DC converter and second voltage output from the second DC-DC converter are added and output as output voltage of the photoelectric conversion device.

11. A photoelectric conversion device comprising:
a first solar cell;
a first DC-DC converter for converting output voltage of the first solar cell;
a second solar cell;
a second DC-DC converter for converting output voltage of the second solar cell; and
a control element for controlling timing of the first DC-DC converter and the second DC-DC converter,
wherein each of the first solar cell and the second solar cell is any one of a solar cell including an amorphous silicon film, a solar cell including a single crystal silicon film, a hetero-junction with intrinsic thin-layer (HIT) solar cell, a CIG-based thin film solar cell, a CdTe solar cell, an organic thin film solar cell, and a dye sensitization solar cell,
wherein the first DC-DC converter comprises a first transistor, the first transistor configured to be turned on with a first signal output from the control element,
wherein the second DC-DC converter comprises a second transistor, the second transistor configured to be turned on with a second signal output from the control element,
wherein a first time period when a level of the first signal is high and a second time period when a level of the second signal is high do not overlap with each other, and
wherein a cycle time of the second signal is half of a cycle time of the first signal.

12. The photoelectric conversion device according to claim 11,
wherein the first solar cell and the second solar cell are stacked.

13. The photoelectric conversion device according to claim 11,
wherein first voltage output from the first DC-DC converter and second voltage output from the second DC-DC converter are added and output as output voltage of the photoelectric conversion device.

14. A photoelectric conversion device comprising:
a first solar cell;
a first voltage conversion element for converting output voltage of the first solar cell;
a second solar cell;
a second voltage conversion element for converting output voltage of the second solar cell; and
a control element for performing maximum power point tracking on the first voltage conversion element and the second voltage conversion element and controlling timing of the first voltage conversion element and the second voltage conversion element,
wherein each of the first solar cell and the second solar cell is any one of a solar cell including an amorphous silicon film, a solar cell including a single crystal silicon film, a hetero-junction with intrinsic thin-layer (HIT) solar cell, a CIG-based thin film solar cell, a CdTe solar cell, an organic thin film solar cell, and a dye sensitization solar cell,
wherein the first voltage conversion element comprises a first transistor, the first transistor configured to be turned on with a first signal output from the control element,
wherein the second voltage conversion element comprises a second transistor, the second transistor configured to be turned on with a second signal output from the control element,
wherein a first time period when a level of the first signal is high and a second time period when a level of the second signal is high do not overlap with each other, and
wherein the first time period is longer than the second time period.

15. The photoelectric conversion device according to claim 14,
wherein the first solar cell and the second solar cell are stacked.

16. The photoelectric conversion device according to claim 14,
wherein first voltage output from the first voltage conversion element and second voltage output from the second voltage conversion element are added and output as an output voltage of the photoelectric conversion device.

17. A photoelectric conversion device comprising:
a first solar cell;
a first voltage conversion element for converting output voltage of the first solar cell;
a second solar cell;
a second voltage conversion element for converting output voltage of the second solar cell; and a control element for performing maximum power point tracking on the first voltage conversion element and the second voltage conversion element and controlling timing of the first voltage conversion element and the second voltage conversion element, wherein each of the first solar cell and the second solar cell is any one of a solar cell including an amorphous silicon film, a solar cell including a single crystal silicon film, a hetero-junction with intrinsic thin-layer (HIT) solar cell, a CIG-based thin film solar cell, a CdTe solar cell, an organic thin film solar cell, and a dye sensitization solar cell, wherein the first voltage conversion element comprises a first transistor, the first transistor configured to be turned on with a first signal output from the control element, wherein the second voltage conversion element comprises a second transistor, the second transistor configured to be turned on with a second signal output from the control element, wherein a first time period when a level of the first signal is high and a second time period when a level of the second signal is high do not overlap with each other, and wherein a cycle time of the second signal is half of a cycle time of the first signal.

18. The photoelectric conversion device according to claim 17,
wherein the first solar cell and the second solar cell are stacked.

19. The photoelectric conversion device according to claim 17,
wherein first voltage output from the first voltage conversion element and second voltage output from the second voltage conversion element are added and output as an output voltage of the photoelectric conversion device.

20. A photoelectric conversion device comprising:
a first solar cell;
a first DC-DC converter for converting output voltage of the first solar cell;
a second solar cell;
a second DC-DC converter for converting output voltage of the second solar cell; and
a control element for performing maximum power point tracking on the first DC-DC converter and the second DC-DC converter and controlling timing of the first DC-DC converter and the second DC-DC converter, wherein each of the first solar cell and the second solar cell the solar cell is any one of a solar cell including an amorphous silicon film, a solar cell including a single crystal silicon film, a hetero junction with intrinsic thin-layer (HIT) solar cell, a CIG-based thin film solar cell, a CdTe solar cell, an organic thin film solar cell, and a dye sensitization solar cell, wherein the first DC-DC converter comprises a first transistor, the first transistor configured to be turned on with a first signal output from the control element, wherein the second DC-DC converter comprises a second transistor, the second transistor configured to be turned on with a second signal output from the control element, wherein a first time period when a level of the first signal is high and a second time period when a level of the second signal is high do not overlap with each other, and wherein the first time period is longer than the second time period.

21. The photoelectric conversion device according to claim 20,
wherein the first solar cell and the second solar cell are stacked.

22. The photoelectric conversion device according to claim 10,
wherein first voltage output from the first DC-DC converter and second voltage output from the second DC-DC converter are added and output as output voltage of the photoelectric conversion device.

23. A photoelectric conversion device comprising:
a first solar cell;
a first DC-DC converter for converting output voltage of the first solar cell;
a second solar cell;
a second DC-DC converter for converting output voltage of the second solar cell; and
a control element for performing maximum power point tracking on the first DC-DC converter and the second DC-DC converter and controlling timing of the first DC-DC converter and the second DC-DC converter, wherein each of the first solar cell and the second solar cell is any one of a solar cell including an amorphous silicon film, a solar cell including a single crystal silicon film, a hetero-junction with intrinsic thin-layer (HIT) solar cell, a CIG-based thin film solar cell, a CdTe solar cell, an organic thin film solar cell, and a dye sensitization solar cell, wherein the first DC-DC converter comprises a first transistor, the first transistor configured to be turned on with a first signal output from the control element, wherein the second DC-DC converter comprises a second transistor, the second transistor configured to be turned on with a second signal output from the control element, wherein a first time period when a level of the first signal is high and a second time period when a level of the second signal is high do not overlap with each other, and wherein a cycle time of the second signal is half of a cycle time of the first signal.

24. The photoelectric conversion device according to claim 23,
wherein the first solar cell and the second solar cell are stacked.

25. The photoelectric conversion device according to claim 23,
wherein first voltage output from the first DC-DC converter and second voltage output from the second DC-DC converter are added and output as output voltage of the photoelectric conversion device.

* * * * *

UNITED STATES PATENT AND TRADEMARK OFFICE
CERTIFICATE OF CORRECTION

| | |
|---|---|
| PATENT NO. | : 9,099,576 B2 |
| APPLICATION NO. | : 13/100553 |
| DATED | : August 4, 2015 |
| INVENTOR(S) | : Hajime Kimura et al. |

It is certified that error appears in the above-identified patent and that said Letters Patent is hereby corrected as shown below:

In the Specification:

Column 5, Line 3; Change "propulsion ear on" to --propulsion car on--.

Column 13, Line 16; Change "72" to --T2--.

Column 27, Line 24; Change "Mdenotes" to --M denotes--.

Column 27, Line 38; Change "plate ME" to --plate RIE--.

Column 28, Line 12; Change "input" to --is put--.

Column 29, Line 63; Change "mariner" to --manner--.

Column 30, Line 6; Change "mariner" to --manner--.

Column 30, Line 12; Change "100 mm." to --100 nm.--.

Column 34, Line 2; Change "6012." to --601_2.--.

In the Claims:

Column 41, Line 47, Claim 20; Change "the solar cell is any one" to --is any one--.

Column 42, Lines 10 to 11, Claim 22; Change "claim 10," to --claim 20,--.

Signed and Sealed this
Sixteenth Day of February, 2016

Michelle K. Lee
*Director of the United States Patent and Trademark Office*